(12) United States Patent
Haga et al.

(10) Patent No.: US 10,269,754 B2
(45) Date of Patent: Apr. 23, 2019

(54) SEMICONDUCTOR DEVICE

(71) Applicant: ROHM CO., LTD., Kyoto-shi, Kyoto (JP)

(72) Inventors: Motoharu Haga, Kyoto (JP); Kaoru Yasuda, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/367,063

(22) Filed: Dec. 1, 2016

(65) Prior Publication Data

US 2017/0162533 A1   Jun. 8, 2017

(30) Foreign Application Priority Data

Dec. 3, 2015   (JP) ................ 2015-236287

(51) Int. Cl.
*H01L 23/00*   (2006.01)

(52) U.S. Cl.
CPC .............. *H01L 24/48* (2013.01); *H01L 24/03* (2013.01); *H01L 24/05* (2013.01); *H01L 24/97* (2013.01); *H01L 24/29* (2013.01); *H01L 24/32* (2013.01); *H01L 24/45* (2013.01); *H01L 24/49* (2013.01); *H01L 24/73* (2013.01); *H01L 24/83* (2013.01); *H01L 24/85* (2013.01); *H01L 2224/0212* (2013.01); *H01L 2224/0346* (2013.01); *H01L 2224/04042* (2013.01); *H01L 2224/05083* (2013.01); *H01L 2224/05084* (2013.01);
(Continued)

(58) Field of Classification Search
CPC ..... H01L 24/48; H01L 24/05; H01L 2224/97; H01L 2924/00011; H01L 2224/73265; H01L 2224/05083; H01L 2224/0212; H01L 2224/0346; H01L 2224/04042; H01L 2924/05042; H01L 2224/05084; H01L 2224/05155

See application file for complete search history.

(56) References Cited

U.S. PATENT DOCUMENTS 4,176,443 A * 12/1979 Iannuzzi ........... H01L 23/53209
                                                    228/123.1
5,116,783 A *  5/1992 Tsumura ................. H01L 24/03
                                                    228/110.1
(Continued)

FOREIGN PATENT DOCUMENTS

JP      2002-76051 A      3/2002

*Primary Examiner* — Bilkis Jahan
(74) *Attorney, Agent, or Firm* — Hamre, Schumann, Mueller & Larson, P.C.

(57) ABSTRACT

A semiconductor device includes a semiconductor element having first and second main surfaces spaced apart in a thickness direction. The semiconductor element includes a metal underlying layer on the first main surface, a bonding pad on the metal underlying layer with a wire bonded to the pad, and an insulative protection layer formed on the first main surface and surrounding the bonding pad. The bonding pad includes first and second conductive layers. The first conductive layer covers the metal underlying layer and is made of a metal having a lower ionization tendency than the metal underlying layer. The second conductive layer covers the first conductive layer and is made of a metal having a lower ionization tendency than the first conductive layer. The first and second conductive layers have respective peripheries held in close contact with the protection layer and covering a part of the protection layer.

12 Claims, 20 Drawing Sheets

(52) U.S. Cl.
CPC ............... *H01L 2224/05155* (2013.01); *H01L 2224/05164* (2013.01); *H01L 2224/05624* (2013.01); *H01L 2224/05644* (2013.01); *H01L 2224/2919* (2013.01); *H01L 2224/29101* (2013.01); *H01L 2224/29294* (2013.01); *H01L 2224/29339* (2013.01); *H01L 2224/32245* (2013.01); *H01L 2224/45139* (2013.01); *H01L 2224/45144* (2013.01); *H01L 2224/45147* (2013.01); *H01L 2224/48091* (2013.01); *H01L 2224/48106* (2013.01); *H01L 2224/48247* (2013.01); *H01L 2224/48465* (2013.01); *H01L 2224/49171* (2013.01); *H01L 2224/73265* (2013.01); *H01L 2224/85181* (2013.01); *H01L 2224/85205* (2013.01); *H01L 2224/85439* (2013.01); *H01L 2224/85447* (2013.01); *H01L 2224/92247* (2013.01); *H01L 2224/97* (2013.01); *H01L 2924/00011* (2013.01); *H01L 2924/05042* (2013.01); *H01L 2924/181* (2013.01)

(56) References Cited

U.S. PATENT DOCUMENTS

| | | | | |
|---|---|---|---|---|
| 5,235,212 A * | 8/1993 | Shimizu | ............... | H01L 23/3171 257/780 |
| 5,661,081 A * | 8/1997 | Hsue | ............... | H01L 24/03 438/106 |
| 6,452,277 B1 * | 9/2002 | Tabaru | ............... | H01L 21/31116 257/734 |
| 2007/0091147 A1 * | 4/2007 | Koyama | ............... | B41J 2/1433 347/63 |
| 2009/0294962 A1 * | 12/2009 | Hsu | ............... | H01L 23/49816 257/738 |
| 2011/0089401 A1 * | 4/2011 | Hiraiwa | ............... | H01L 33/38 257/13 |
| 2011/0175179 A1 * | 7/2011 | Chiu | ............... | B81B 7/007 257/418 |
| 2011/0215400 A1 * | 9/2011 | Nakamura | ............... | H01L 29/66 257/334 |
| 2014/0284790 A1 * | 9/2014 | Matsumoto | ............... | H01L 22/32 257/737 |

* cited by examiner

SEMICONDUCTOR DEVICE

BACKGROUND OF THE INVENTION

1. Field of the Invention

The present invention relates to a semiconductor device.

2. Description of the Related Art

Various types of semiconductor devices have been proposed that perform a specific function on the basis of inputs and outputs of a current from an external device, for example as disclosed in JP-A-No. 2002-76051. The conventional semiconductor device of this document includes a semiconductor element, a bonding pad, a protection layer, a wire, and a lead frame. The bonding pad is formed on the semiconductor element. The protection layer is also formed on the semiconductor element. The protection layer is located adjacent to the bonding pad, so as to cover the periphery of the bonding pad. The wire is bonded to the bonding pad and the lead frame.

The bonding pad is formed by stacking a metal, for example Al (aluminum). To bond a wire to the bonding pad, a wire, which is made of e.g. Cu (copper) and provided through a bonding tool such as a capillary, is molten and pressed against the bonding pad by the tip portion of the capillary, and ultrasonic vibration is applied. In this process, since Al is a relatively soft material, fragments of the bonding pad may disperse or the pad may crack due to the pressure and vibration applied during the wire bonding.

Further, in a conventional semiconductor device of JP-A-No. 2002-76051 (FIGS. 2 and 3), the periphery of the metal layer formed by stacking a plurality of metal films is covered with a protection layer, and the exposed portion of the upper face of the metal layer is serves as a bonding pad. With this configuration, however, the metal layer is formed over a larger region than the exposed portion as the bonding pad, which is disadvantageous to making the semiconductor device smaller in size. In addition, the protection layer covering the periphery of the metal layer may detach from the metal layer. When the underlying metal layer is exposed owing to the detachment of the protection layer, the uncovered portion of the metal layer may be corroded, and the durability of the semiconductor device may be degraded.

SUMMARY OF THE INVENTION

The present invention has been proposed in view of the foregoing situation. It is therefore an object of the invention to provides a semiconductor device that can be manufactured in a smaller size and with improved durability.

According to an aspect of the present invention, there is provided a semiconductor device is provided with: a semiconductor element including a first main surface and a second main surface that are spaced apart from each other in a thickness direction; and a wire. The semiconductor element includes: a metal underlying layer formed on the first main surface; a bonding pad formed on the metal underlying layer and to which the wire is bonded; and an insulative protection layer formed on the first main surface and surrounding the bonding pad as viewed in the thickness direction. The bonding pad includes: a first conductive layer covering the metal underlying layer and made of a metal having a lower ionization tendency than the metal underlying layer; and a second conductive layer covering the first conductive layer and made of a metal having a lower ionization tendency than the first conductive layer. The first conductive layer and the second conductive layer have peripheries, respectively, that are in close contact with the protection layer and cover a part of the protection layer.

Other features and advantages of the present invention will become more apparent from the detailed description give below with reference to the accompanying drawings.

DETAILED DESCRIPTION OF PREFERRED EMBODIMENTS

Preferred embodiments of the present invention will be described below with reference to the accompanying drawings.

Figure 1:
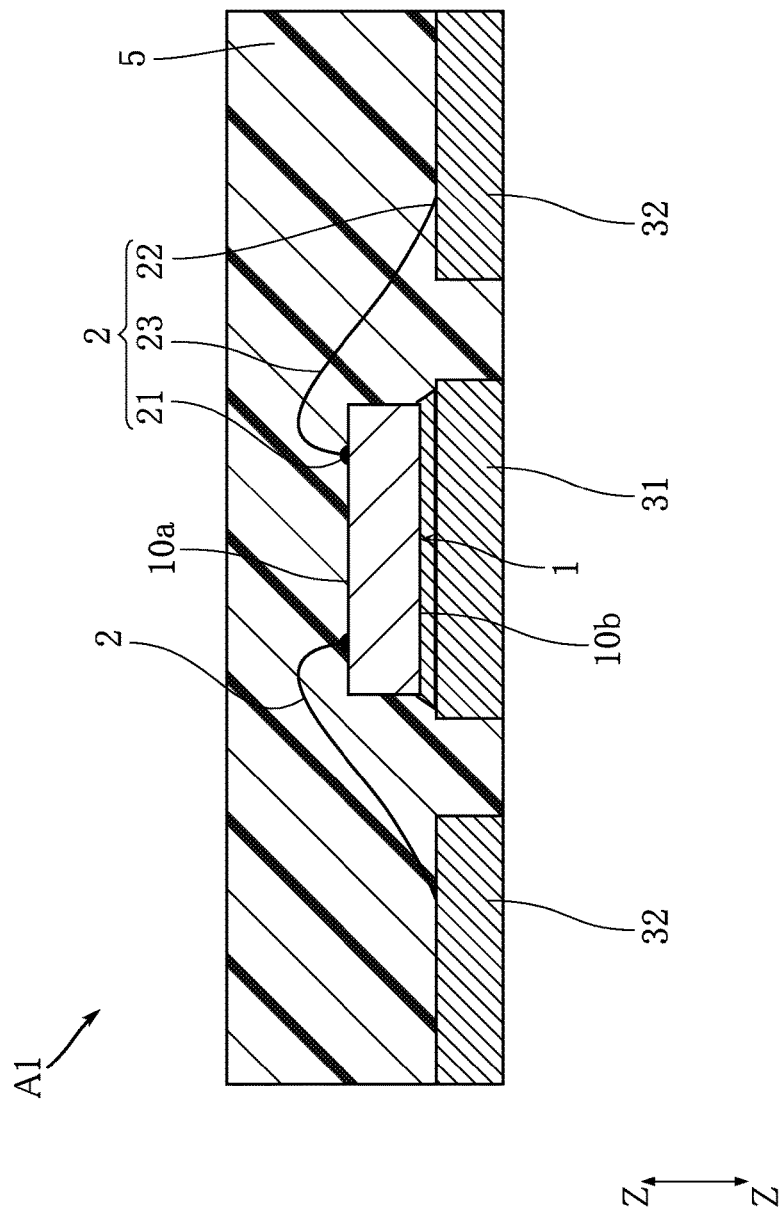
FIG. 1 is a cross-sectional view of a semiconductor device according to a first embodiment of the present invention.
Figure 2:
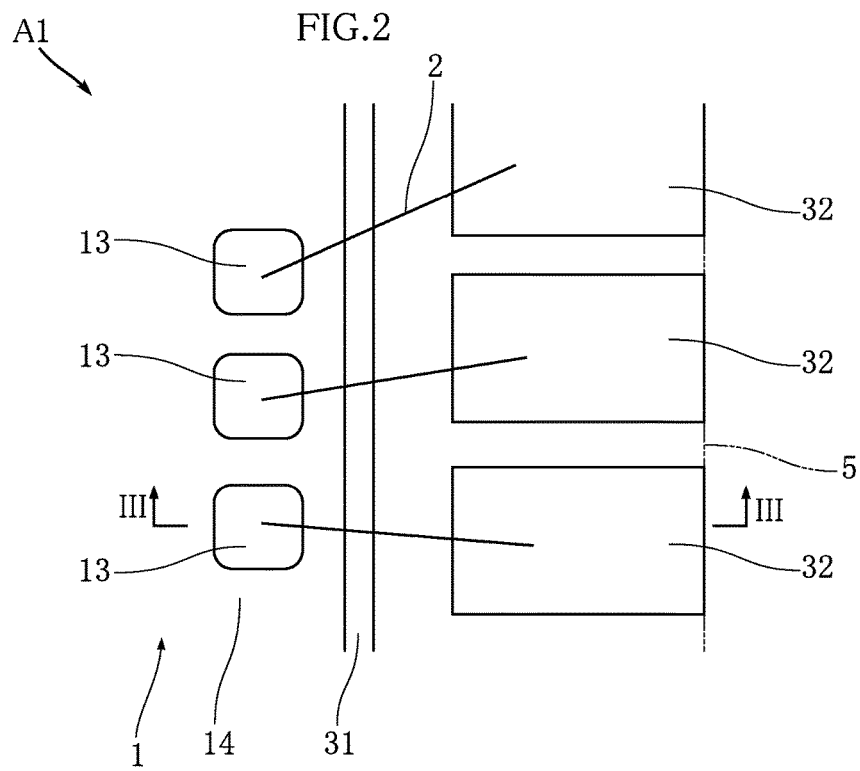
FIG. 2 is a plan view of the semiconductor device shown in FIG. 1, with a sealing resin indicated by imaginary lines.
Figure 3:
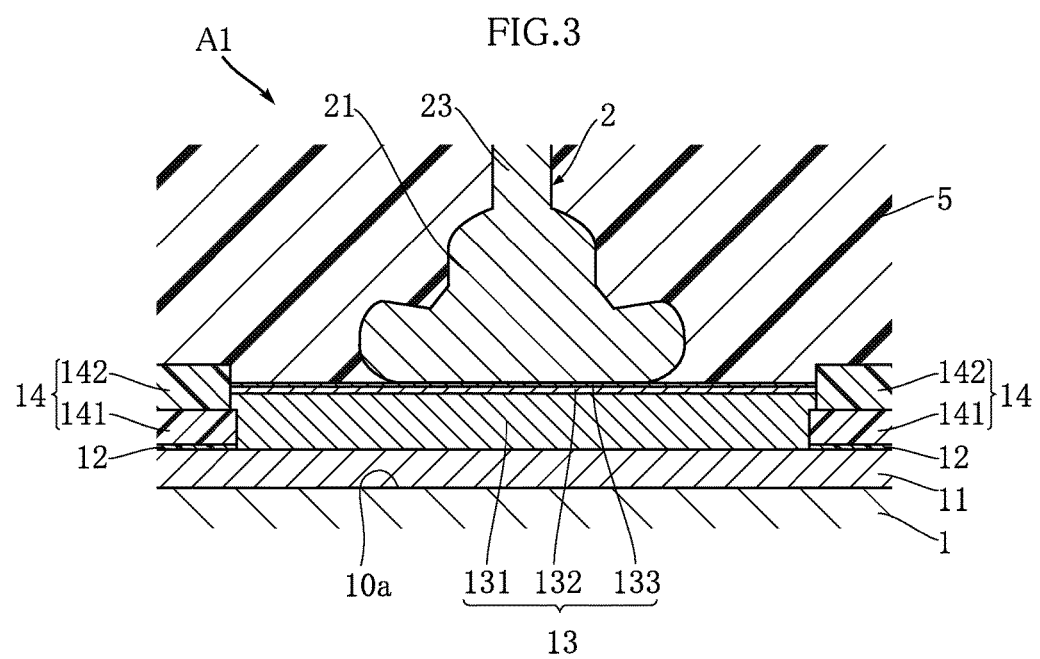
FIG. 3 is an enlarged fragmentary cross-sectional view of a part of FIG. 1.
Figure 4:
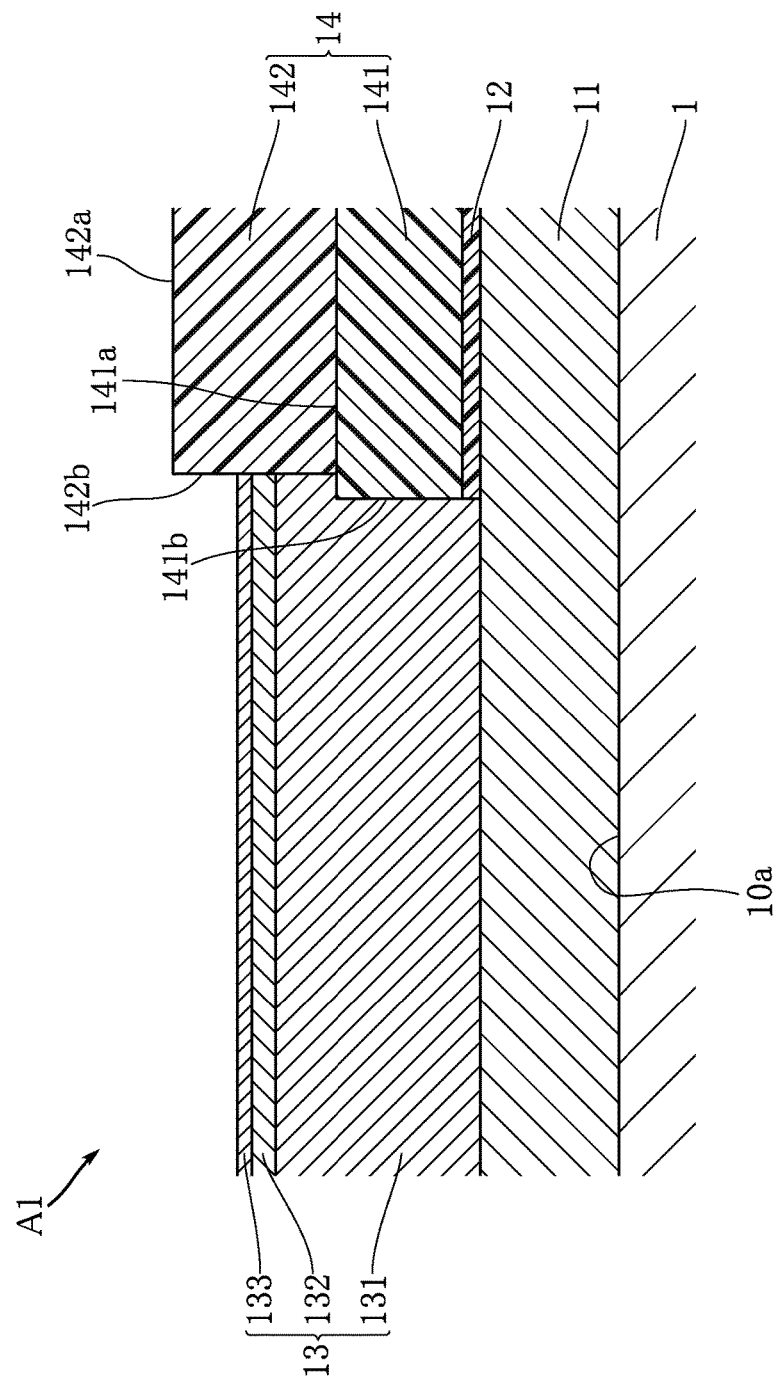
FIG. 4 is an enlarged fragmentary cross-sectional view of a part of FIG. 3.

FIG. 1 to FIG. 4 illustrate a semiconductor device according to a first embodiment of the present invention. The semiconductor device A1 of this embodiment includes a semiconductor element 1, wires 2, a main electrode 31, sub electrodes 32, and a sealing resin 5. FIG. 2 is a plan view of the semiconductor device shown in FIG. 1, the sealing resin being indicated by imaginary lines. FIG. 3 is an enlarged fragmentary cross-sectional view of a part of FIG. 1. FIG. 4 is an enlarged fragmentary cross-sectional view of a part of FIG. 3. In FIG. 4, the wires 2 and the sealing resin 5 are omitted.

The semiconductor element 1 is configured to perform a desired function, and may be exemplified, without specific limitation, by a transistor, a diode, a capacitor, and so forth. As shown in FIG. 1, the semiconductor element 1 includes a first main surface 10a and a second main surface 10b. The first main surface 10a and the second main surface 10b are oriented in opposite directions to each other, in a thickness direction of the semiconductor element 1 (Z-Z direction in FIG. 1). On the first main surface 10a, a non-illustrated functional circuit that realize the function of the semiconductor element is formed. The second main surface 10b in contact with the main electrode 31. The semiconductor element 1 is manufactured, for example, from a wafer made of Si.

As shown in FIG. 2 and FIG. 3, the semiconductor element 1 includes a metal underlying layer 11, an insulation layer 12, bonding pads 13, and a protection layer 14. The metal underlying layer 11, formed on the first main surface 10a, is made of a metal such as Al. The metal underlying layer 11 has a thickness of, for example, 0.5 µm to 5 µm.

The insulation layer 12, formed on the metal underlying layer 11, is made of an insulative material such as $SiO_2$. The insulation layer 12 is, for example, formed so as to surround a predetermined region of a rectangular shape. The insulation layer 12 has a thickness of, for example, 0.1 µm to 0.5 µm.

As shown in FIG. 2, the protection layer 14 surrounds the bonding pads 13 in a view in the thickness direction of the semiconductor element 1. As shown in FIG. 3, the protection layer 14 is formed on the first main surface 10a. The protection layer 14 is stacked on the metal underlying layer 11 via the insulation layer 12. In other words, the insulation layer 12 is interposed between the metal underlying layer 11 and the protection layer 14.

The protection layer 14 includes a first protection layer 141 and a second protection layer 142. The first protection layer 141 is superposed on the insulation layer 12, and made of an insulative material such as SiN. The first protection layer 141 serves to prevent Si, the predominant constituent of the semiconductor element 1, from being subjected to an excessive force, and is so-called a passivation layer. The first protection layer 141 has a thickness of, for example, 1 µm to 4 µm. The second protection layer 142 is superposed on the first protection layer 141, and made of an insulative material such as polyimide. The second protection layer 142 has a thickness of, for example, 3 µm to 6 µm.

Referring now to FIG. 4, the first protection layer 141 includes an upper face 141a and a first side face 141b. The upper face 141a is oriented in the same direction as the first main surface 10a of the semiconductor element 1. The first side face 141b is oriented to the bonding pad 13, in a direction orthogonal to the thickness direction (up-down direction in FIG. 4) of the semiconductor element 1.

The second protection layer 142 includes an upper face 142a and a second side face 142b. The upper face 142a is oriented in the same direction as the first main surface 10a of the semiconductor element 1. The second side face 142b is oriented to the bonding pad 13, in a direction orthogonal to the thickness direction of the semiconductor element 1. As shown in FIG. 4, in this embodiment the second side face 142b of the second protection layer 142 is recessed in a direction opposite to the bonding pad 13, with respect to the first side face 141b of the first protection layer 141.

The bonding pads 13 are formed on the first main surface 10a. The bonding pads 13 each include a first conductive layer 131, a second conductive layer 132, and a third conductive layer 133. The first to the third conductive layers 131 to 133 are each formed by metal plating.

The first conductive layer 131 covers the metal underlying layer 11. The first conductive layer 131 is made of a metal having lower ionization tendency than the metal underlying layer 11. The first conductive layer 131 has higher hardness than the metal underlying layer 11. For example, the first conductive layer 131 made of Ni satisfies such properties. The first conductive layer 131 has a thickness of, for example, 2 µm to 9 µm. The periphery of the first conductive layer 131 is in close contact with the surface of the protection layer 14. The first conductive layer 131 is thicker than the first protection layer 141. In contrast, the first conductive layer 131 is thinner than the overall thickness of the protection layer 14 (total of thicknesses of first protection layer 141 and second protection layer 142). In this embodiment, accordingly, the first conductive layer 131 covers the entirety of the first side face 141b of the first protection layer 141 and a part of the second side face 142b of the second protection layer 142.

The second conductive layer 132 covers the first conductive layer 131. The second conductive layer 132 is made of a metal having lower ionization tendency than the first conductive layer 131. The second conductive layer 132 has higher hardness than the first conductive layer 131. For example, the second conductive layer 132 made of Pd satisfies such properties. The second conductive layer 132 has a thickness of, for example, 0.1 µm to 0.5 µm. The periphery of the second conductive layer 132 is in close contact with the surface of the protection layer 14. The second conductive layer 132 is thinner than the second protection layer 142. In this embodiment, the second conductive layer 132 covers a part of the second side face 142b of the second protection layer 142.

The third conductive layer 133 covers the second conductive layer 132. The third conductive layer 133 is made of a metal having lower ionization tendency than the second conductive layer 132. For example, the third conductive layer 133 made of Au satisfies such properties. The third conductive layer 133 has a thickness of, for example, 10 nm to 0.1 μm. The periphery of the third conductive layer 133 is in close contact with the surface of the protection layer 14. The third conductive layer 133 is thinner than the second protection layer 142. In this embodiment, the third conductive layer 133 covers a part of the second side face 142b of the second protection layer 142. In addition, in this embodiment the overall thickness of the bonding pad 13 is thinner than the overall thickness of the protection layer 14. Accordingly, the bonding pad leaves the upper face 142a of the second protection layer 142 exposed.

As shown in FIG. 1, the wires 2 are each bonded to the first main surface 10a of the semiconductor element 1. The wires 2 are also bonded to the sub electrode 32. The wire 2 may be made of, for example, Cu, Au, or Ag. In this embodiment, the wire 2 is made of Cu.

The wire 2 includes bonding sections 21 and 22, and a bridge section 23.

The bonding section 21 corresponds to the portion bonded to the semiconductor element 1. To be more detailed, the bonding section 21 is bonded to the third conductive layer 133 (bonding pad 13) of the semiconductor element 1, as shown in FIG. 3. In the manufacturing process of the semiconductor device A1, the bonding section 21 is bonded prior to the bonding section 22. Accordingly, the bonding section 21 is a first bonding section.

The bonding section 22 corresponds to the portion bonded to the sub electrode 32. In the manufacturing process of the semiconductor device A1, the bonding section 22 is bonded after the bonding section 21. Accordingly, the bonding section 22 is a second bonding section. The bonding section 22 includes a joint region with the sub electrode 32, extending in one direction.

The bridge section 23 continuously extends to the bonding section 21 and the bonding section 22. The bridge section 23 extends linearly, and has a circular cross-section.

The sub electrode 32 is made of a conductive material. The sub electrode 32 originates from a lead frame. Though not illustrated in detail, the sub electrode 32 includes a Cu portion and an Ag layer. The Cu portion includes the Ag layer formed therein. The Cu portion is thicker than the Ag layer. To the Ag layer, the wire 2 is bonded.

The main electrode 31 is made of a conductive material. The main electrode 31 originates from the lead frame. The main electrode 31 also includes the Cu portion and the Ag layer like the sub electrode 32, however since the Cu portion and the Ag layer are configured in the same way as above, the description will not be repeated. The semiconductor element 1 is mounted on the main electrode 31 via an adhesive layer.

The sealing resin 5 encloses therein the semiconductor element 1 and the wires 2. More specifically, the sealing resin 5 covers the semiconductor element 1, the wires 2, the main electrode 31, and the sub electrode 32. The sealing resin 5 is, for example, made of an epoxy resin. An end face of the sub electrode 32 is exposed from the sealing resin 5. The exposed end face corresponds to the cut section formed when the lead frame is cut.

Referring now to FIG. 5 to FIG. 13, a manufacturing method of the semiconductor device A1 will be described.

Figure 5:
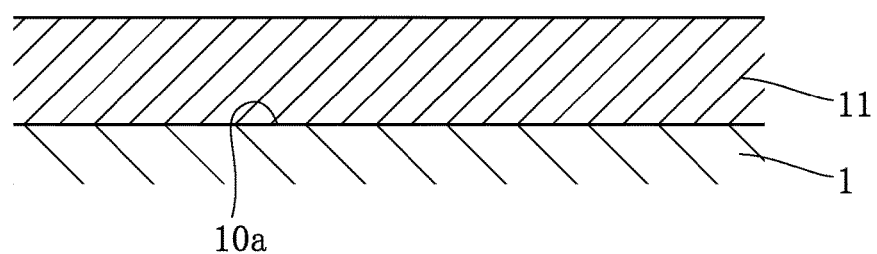
FIG. 5 is a fragmentary cross-sectional view showing a manufacturing process in a manufacturing method of the semiconductor device shown in FIG. 1.

Referring first to FIG. 5, the metal underlying layer 11 is formed on the semiconductor element 1. The metal underlying layer 11 is electrically connected to a predetermined position of a non-illustrated functional circuit formed on the first main surface 10a of the semiconductor element 1. The metal underlying layer 11 may be formed into a pattern, for example by Al plating. The metal underlying layer 11 is formed in a thickness of, for example, 0.5 μm to 5 μm.

Figure 6:
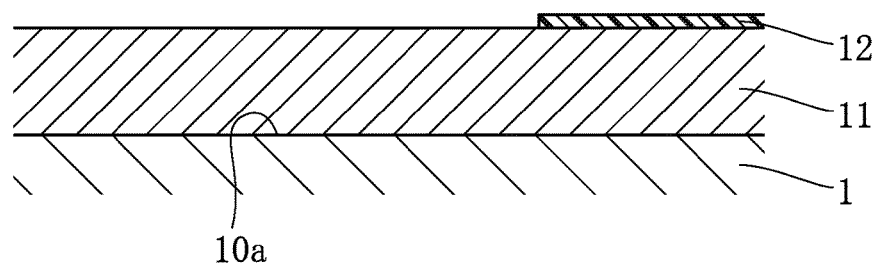
FIG. 6 is a fragmentary cross-sectional view showing a process that follows the process of FIG. 5.

Referring to FIG. 6, the insulation layer 12 is formed. Although the formation method of the insulation layer 12 is not specifically limited, for example a deposition process such as chemical vapor deposition (CVD) may be employed to form a thin film of $SiO_2$ on a predetermined position of the metal underlying layer 11.

Figure 7:
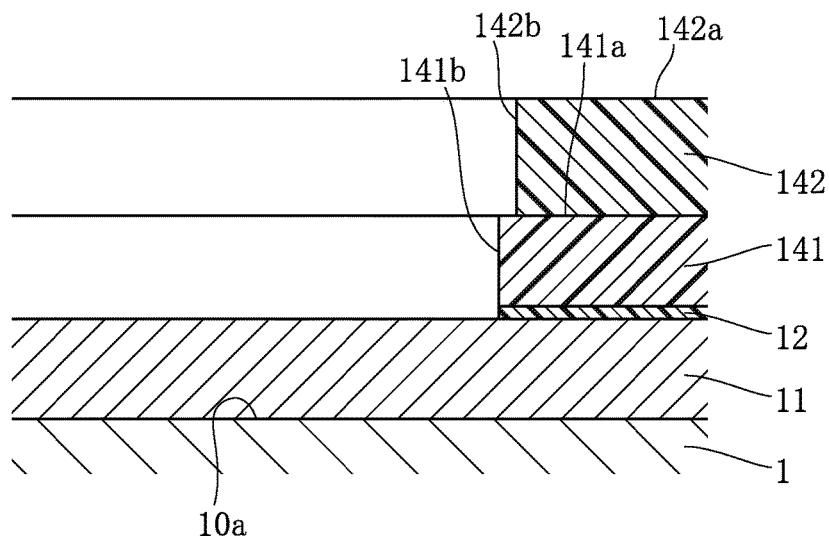
FIG. 7 is a fragmentary cross-sectional view showing a process that follows the process of FIG. 6.

Proceeding to FIG. 7, the first protection layer 141 and the second protection layer 142 are formed. To form the first protection layer 141 and the second protection layer 142, for example, first a SiN layer and a polyimide layer are formed all over. The SiN layer is formed in a thickness of, for example, 1 μm to 4 μm. The polyimide layer is formed in a thickness of, for example, 3 μm to 6 μm. Then the polyimide layer and the SiN layer are partially removed through a patterning process such as etching, so as to expose the metal underlying layer 11. The second side face 142b and the first side face 141b can be thus formed. To partially remove the polyimide layer and the SiN layer, for example an anisotropic dry etching process with a mask may be employed. To partially remove the polyimide layer and the SiN layer, masks different in opening pattern from each other are employed. The opening of the mask for the polyimide layer (second protection layer 142) is larger than the opening of the mask for the SiN layer (first protection layer 141). With such arrangements, the first protection layer 141 and the second protection layer 142 can be formed such that the second side face 142b is recessed with respect to the first side face 141b.

Figure 8:
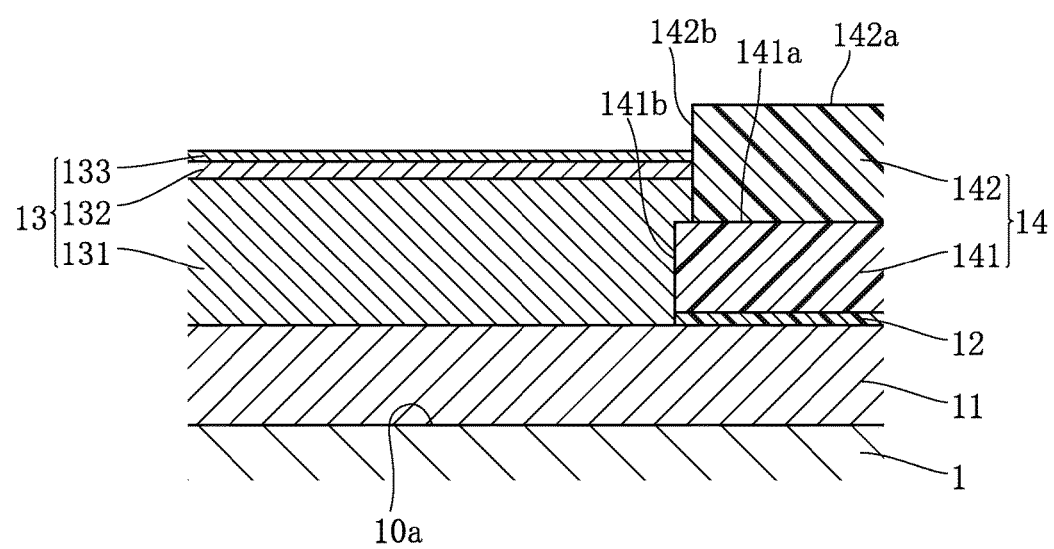
FIG. 8 is a fragmentary cross-sectional view showing a process that follows the process of FIG. 7.

Proceeding to FIG. 8, the bonding pad 13 is formed. To form the bonding pad 13, the first conductive layer 131, the second conductive layer 132, and the third conductive layer 133 are stacked on the region where the metal underlying layer 11 is exposed. The first conductive layer 131 is formed in a thickness of, for example, 2 μm to 9 μm. The second conductive layer 132 is formed in a thickness of, for example, 0.1 μm to 0.5 μm, and the third conductive layer 133 is formed in a thickness of, for example, 10 nm to 0.1 μm. The first to the third conductive layers 131 to 133 are each formed by metal plating, for example a non-electrolytic Ni/Pd/Au plating process. Through the mentioned process, the periphery of the bonding pad 13 (first conductive layer 131, second conductive layer 132, and third conductive layer 133) enters into close contact with the surface of the protection layer 14 (first protection layer 141 and second protection layer 142), so as to cover a part of the protection layer 14.

Figure 9:
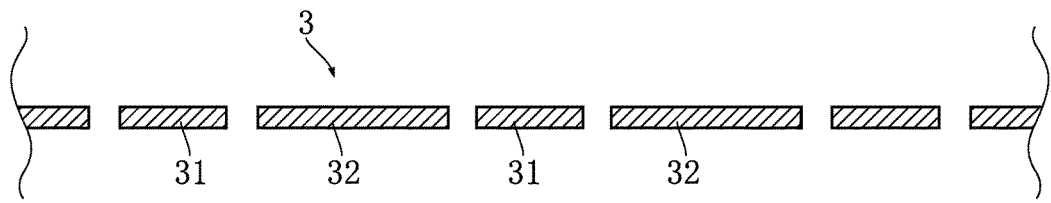
FIG. 9 is a fragmentary cross-sectional view showing a process that follows the process of FIG. 8.

Proceeding to FIG. 9, a lead frame 3 is prepared. The lead frame 3 includes portions to be formed into the main electrode 31 and the sub electrode 32. The lead frame 3 also includes the Cu portion and the Ag layer. The Cu portion and the Ag layer are the same as those described above with reference to the main electrode 31 and the sub electrode 32, and therefore the description will not be repeated.

Figure 10:
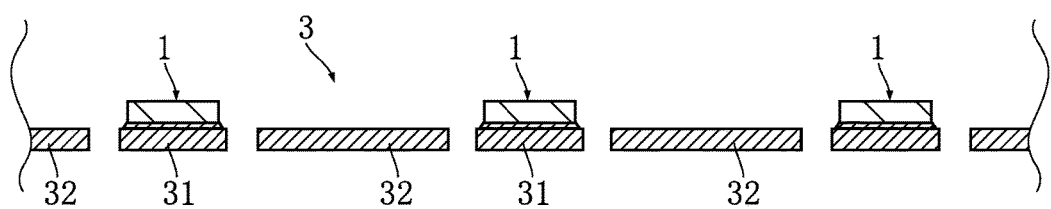
FIG. 10 is a fragmentary cross-sectional view showing a process that follows the process of FIG. 9.

Proceeding to FIG. 10, the semiconductor element 1 is mounted on the lead frame 3 (main electrode 31). For example, a bonding material such as a silver paste or solder may be employed to mount the semiconductor element 1 on the main electrode 31.

Figure 11:
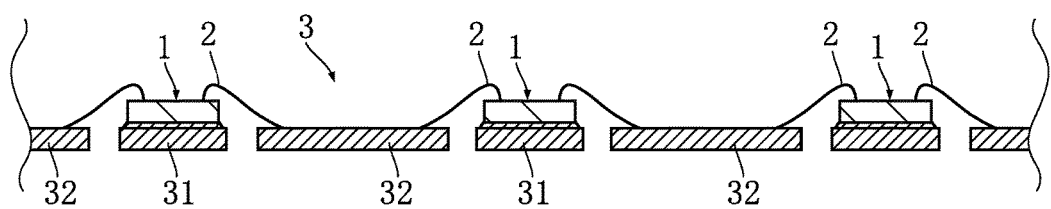
FIG. 11 is a fragmentary cross-sectional view showing a process that follows the process of FIG. 10.

Proceeding to FIG. 11, the wires 2 are bonded to the semiconductor element 1 and the sub electrode 32. For the bonding of the wires 2, for example a non-illustrated capillary is employed. More specifically, first the wire 2 is bonded to the semiconductor element 1 (first bonding). To do so, the wire 2 is passed through the capillary and drawn out from the tip portion of the capillary, and the leading end portion of the wire 2 is molten. Then ultrasonic vibration is applied to the leading end portion of the wire 2 while the leading end portion of the wire 2 is pressed against the bonding pad 13 of the semiconductor element 1, by the capillary. Through such a process, the leading end portion of the wire 2 is bonded to the semiconductor element 1 (bonding pad 13). Then the capillary is separated from the semiconductor element 1. At this point, the bonding section 21 shown in FIG. 3 is formed.

Then the capillary is moved while drawing out the wire 2 so as to form a wire loop, and the wire 2 is bonded to the sub electrode 32 (second bonding). The ultrasonic vibration is applied to the wire 2 while the wire 2 is pressed against the sub electrode 32, so as to fix the wire 2 to the sub electrode 32 (Ag layer in this embodiment). When the wire 2 is fixed to the sub electrode 32, the capillary is lifted with the wire 2 passed therethrough being clamped, to thereby cut the wire 2 (not shown). At this point, the semiconductor element 1 and the sub electrode 32 are electrically connected to each other via the wire loop made of the wire 2 (see FIG. 11). Then a plurality of wires 2 are bonded in the same manner.

Figure 12:
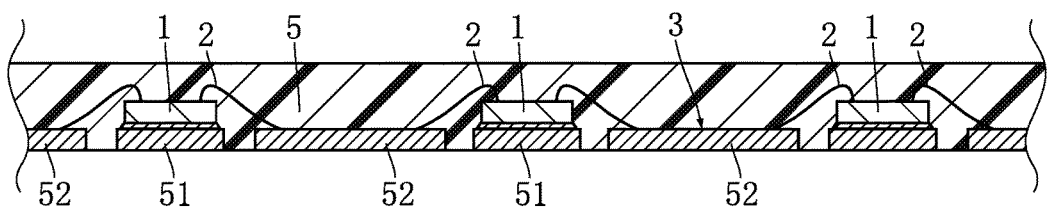
FIG. 12 is a fragmentary cross-sectional view showing a process that follows the process of FIG. 11.

Then the sealing resin 5 covering the wire 2 and the lead frame 3 is formed as shown in FIG. 12, with a desired mold.

Figure 13:
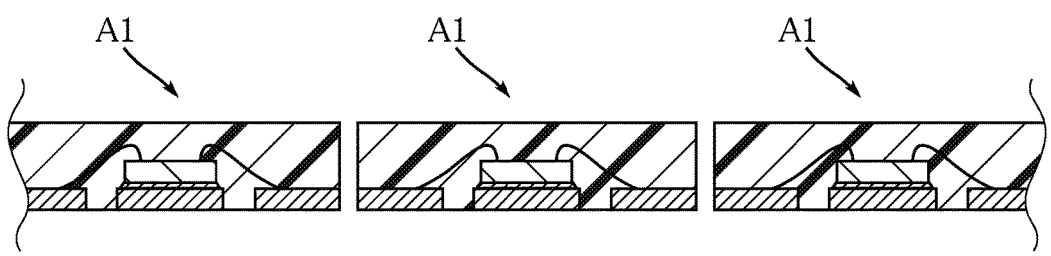
FIG. 13 is a fragmentary cross-sectional view showing a process that follows the process of FIG. 12.

Referring to FIG. 13, the sealing resin 5 and the lead frame 3 are cut into individual pieces, after the formation of the sealing resin 5. Thus, a plurality of semiconductor devices A1 can be obtained.

The semiconductor device A1 provides the following advantageous effects.

In this embodiment, the bonding pad 13 is made of a metal having lower ionization tendency than the metal underlying layer 11, and the ionization tendency of the first conductive layer 131, the second conductive layer 132, and the third conductive layer 133 becomes lower in the order in which these layers are stacked on the metal underlying layer 11. Such a configuration effectively prevents the corrosion of the metal underlying layer 11 and the first conductive layer 131 located on the lower side.

The periphery of the bonding pad 13 (first conductive layer 131, second conductive layer 132, and third conductive layer 133) is in close contact with the surface of the protection layer 14 (first protection layer 141 and second protection layer 142), so as to cover a part of the protection layer 14. The mentioned configuration effectively prevents the protection layer 14 from being delaminated, because of the close contact between the bonding pad 13 and the protection layer 14, compared with the case where, unlike in this embodiment, the protection layer is formed so as to cover the periphery of the bonding pad. Accordingly, the durability of the semiconductor device A1 can be improved.

In addition, since the periphery of the bonding pad 13 covers a part of the surface of the protection layer 14, the region where the first to the third conductive layers 131 to 133 constituting the bonding pad 13 are formed corresponds to the region where the metal of the bonding pad 13 is exposed, in a view in the thickness direction of the semiconductor element 1. Accordingly, the formation region of the first to the third conductive layers 131 to 133 constituting the bonding pad 13 can be made smaller, compared with the case where, unlike in this embodiment, the protection layer is formed so as to cover the periphery of the bonding pad. Such a configuration contributes to reducing the size of the semiconductor device A1.

In this embodiment, the second side face 142b of the second protection layer 142 is recessed in the direction opposite to the bonding pad 13, with respect to the first side face 141b of the first protection layer 141. In addition, the first conductive layer 131 is thicker than the first protection layer 141, and is in close contact with the entirety of the first side face 141b of the first protection layer 141, a part of the upper face 141a, and a part of the second side face 142b of the second protection layer 142, so as to collectively cover the mentioned regions. Therefore, the first conductive layer 131 (bonding pad 13) effectively prevents the delamination of the first protection layer 141. The mentioned configuration further prevents moisture or a foreign matter from intruding as far as the metal underlying layer 11 through the interface between the first conductive layer 131 (bonding pad 13) and the protection layer 14.

The first conductive layer 131 and the second conductive layer 132 have higher hardness than the metal underlying layer 11. Accordingly, even though the pressure of the capillary is applied to the bonding pad 13 during the bonding process of the wire 2 to the bonding pad 13, the bonding pad 13 and the metal underlying layer 11 can be prevented from being cracked or damaged.

FIG. 14 to FIG. 17 illustrate variations of the semiconductor device A1.

Figure 14:
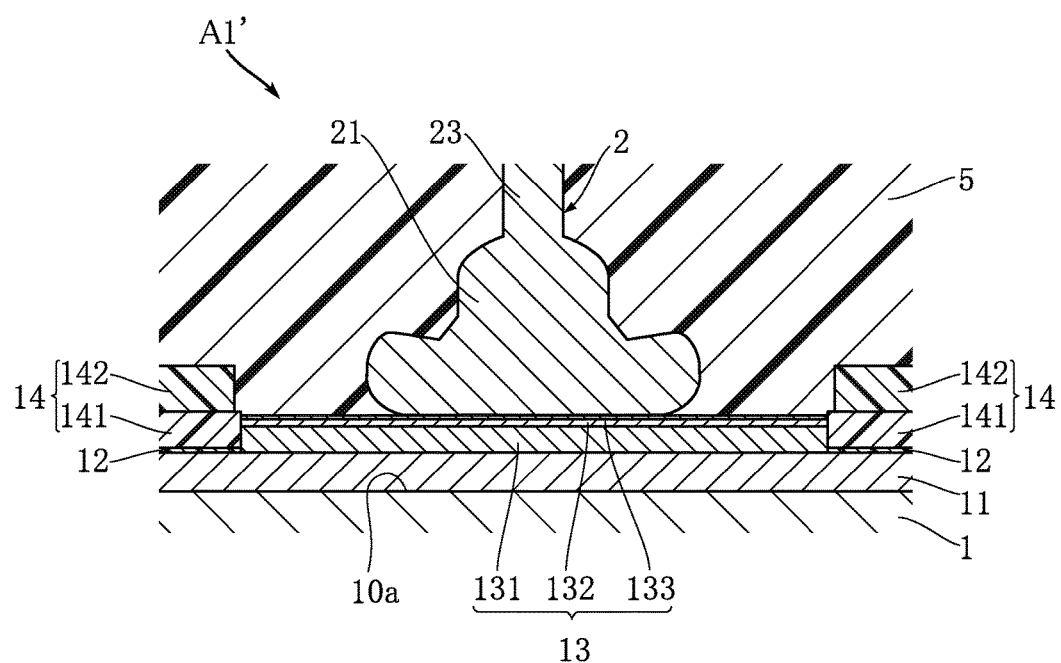
FIG. 14 is an enlarged fragmentary cross-sectional view of a variation of the semiconductor device according to the first embodiment of the present invention.
Figure 15:
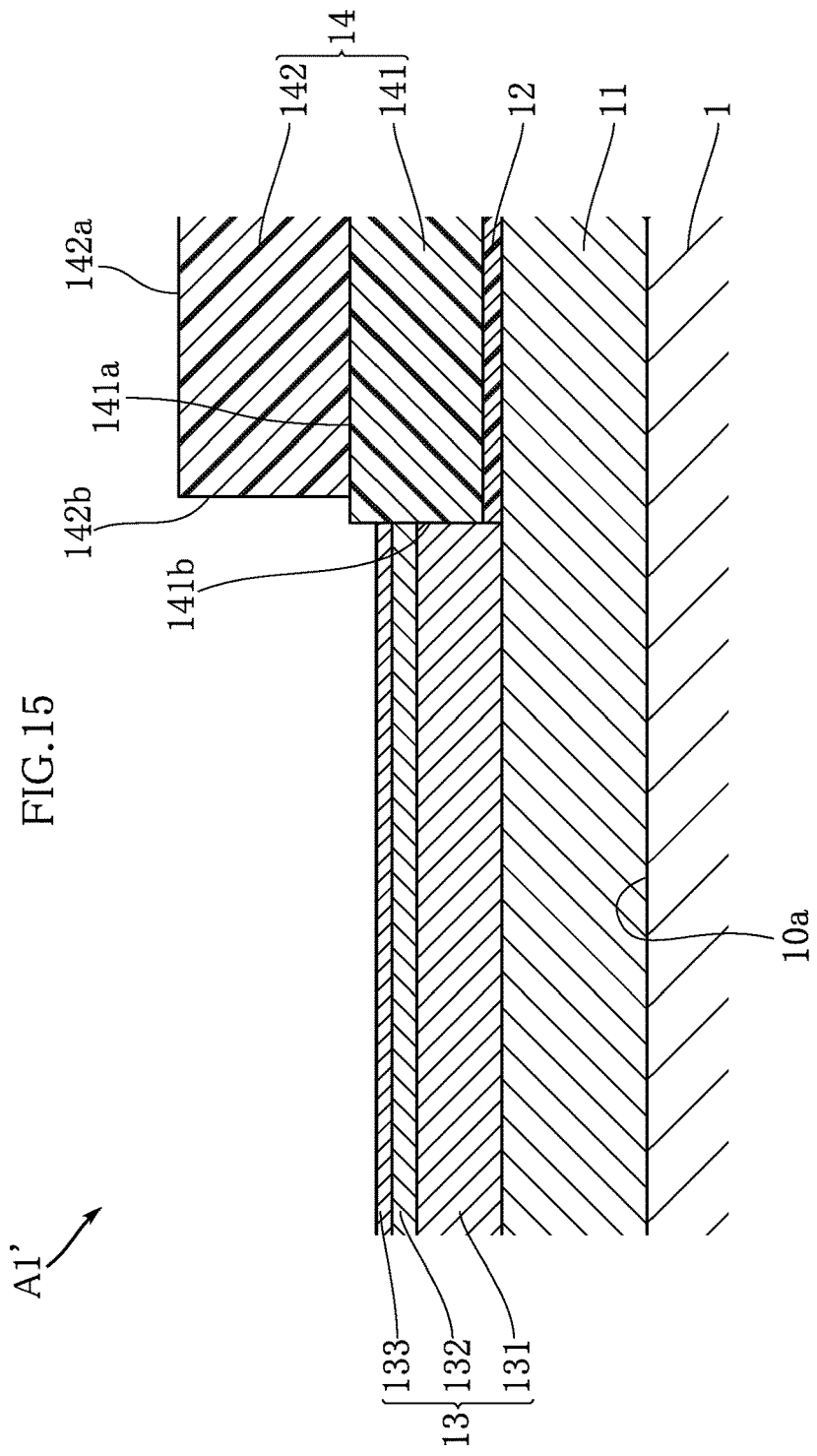
FIG. 15 is an enlarged fragmentary cross-sectional view of a part of FIG. 14.

A semiconductor device A1' shown in FIG. 14 and FIG. 15 is different from the semiconductor device A1 in the thickness of the bonding pad 13.

More specifically, in this variation the first conductive layer 131 in the semiconductor device A1' is thinner than e first conductive layer 131 in the semiconductor device A1. The first conductive layer 131 is thinner than the first protection layer 141. In addition, the overall thickness of the bonding pad 13 (total of thicknesses of first conductive layer 131, second conductive layer 132, and third conductive layer 133) is thinner than the first protection layer 141. Accordingly, the bonding pad 13 covers a part of the first side face 141b of the first protection layer 141, and exposes the second protection layer 142. The semiconductor device A1' thus configured also provides the same advantageous effects as those provided by the semiconductor device A1.

Figure 16:
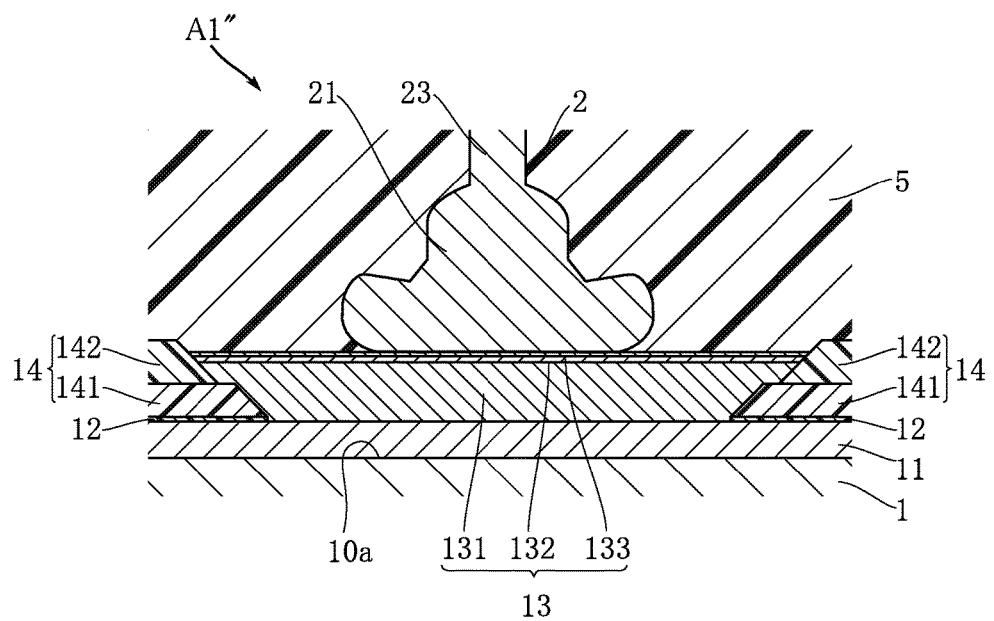
FIG. 16 is an enlarged fragmentary cross-sectional view of another variation of the semiconductor device according to the first embodiment of the present invention.
Figure 17:
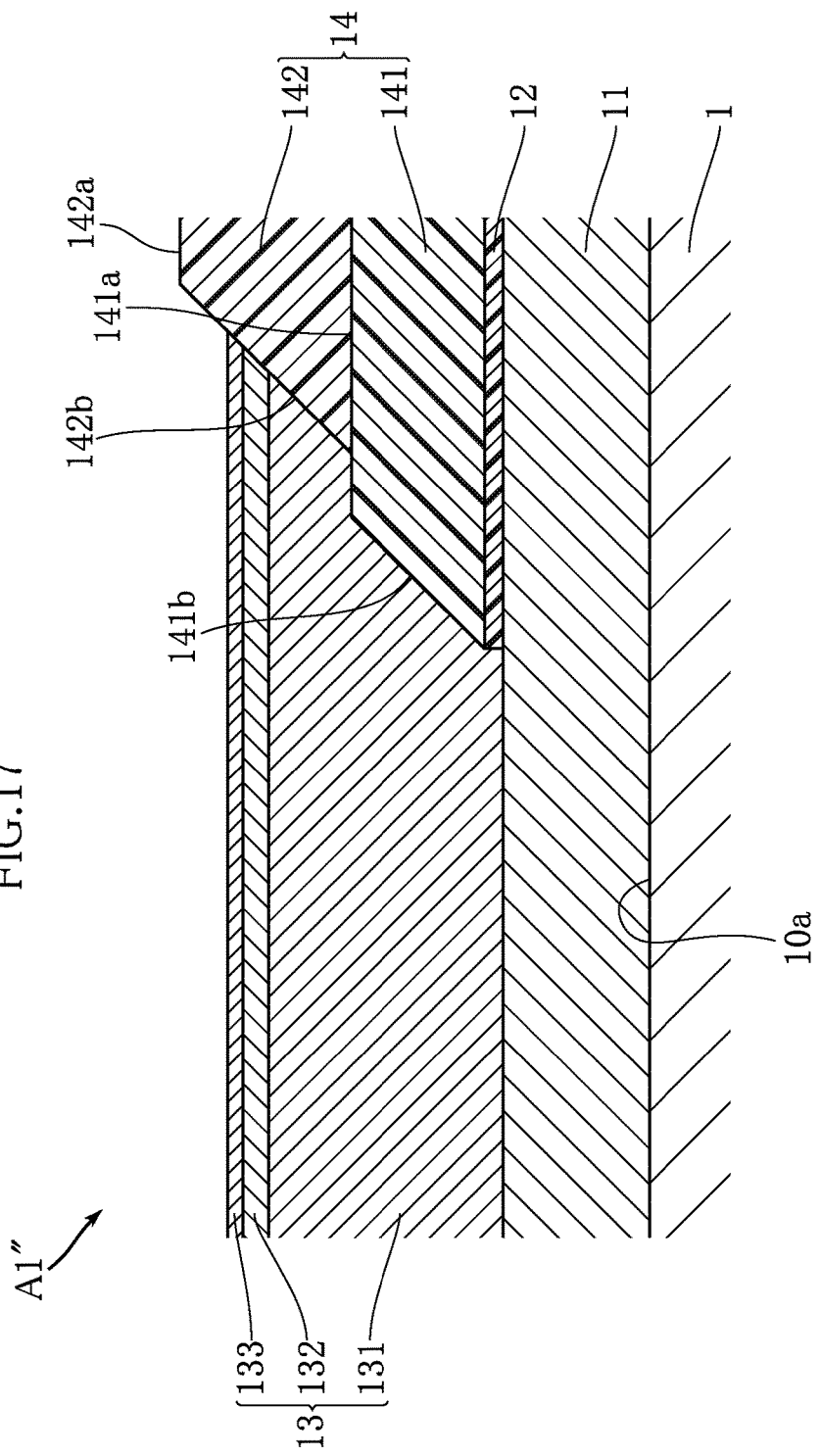
FIG. 17 is an enlarged fragmentary cross-sectional view of a part of FIG. 16.

A semiconductor device A1" shown in FIG. 16 and FIG. 17 is different from the semiconductor device A1 in the shape of the first side face 141b of the first protection layer 141, and the shape of the second side face 142b of the second protection layer 142.

More specifically, in the semiconductor device A1" according to this variation, the first side face 141b of the first protection layer 141 and the second side face 142b of the second protection layer 142 are each inclined so as to be more distant from the bonding pad 13, in the direction away from the semiconductor element 1 in the thickness direction of the semiconductor element 1. The first side face 141b and the second side face 142b inclined as above may be formed, for example, by removing a part of the polyimide layer and the SiN layer respectively constituting the second protection layer 142 and the first protection layer 14, through an isotropic wet etching process.

The first conductive layer 131 is thicker than the first protection layer 141, but thinner than the overall thickness of the protection layer 14 (total of thicknesses of first protection layer 141 and second protection layer 142). Therefore, the first conductive layer 131 covers the entirety of the first side face 141b of the first protection layer 141 and a part of the second side face 142b of the second protection layer 142. The second conductive layer 132 is thinner than the second protection layer 142. The second conductive layer 132 covers a part of the second side face 142b of the second protection layer 142. The third conductive layer 133 is thinner than the second protection layer 142. The third conductive layer 133 covers a part of the second side face 142b of the second protection layer 142. The overall thickness of the bonding pad 13 is thinner than the overall thickness of the protection layer 14. Because of the mentioned configuration, the bonding pad 13 leaves the upper face 142a of the second protection layer 142 exposed.

The semiconductor device A1" thus configured also provides the same advantageous effects as those provided by the semiconductor device A1. Further, forming the first side face 141b and the second side face 142b in the inclined shape as above enables the bonding pad 13 (first to third conductive layers 131, 132, 133) covering the first side face 141b and the second side face 142b to more effectively prevent the first protection layer 141 and the second protection layer 142 from being delaminated from the end portions thereof (vicinity of first side face 141b and second side face 142b), thereby further assuring the prevention of the delamination of the protection layer 14.

Figure 18:
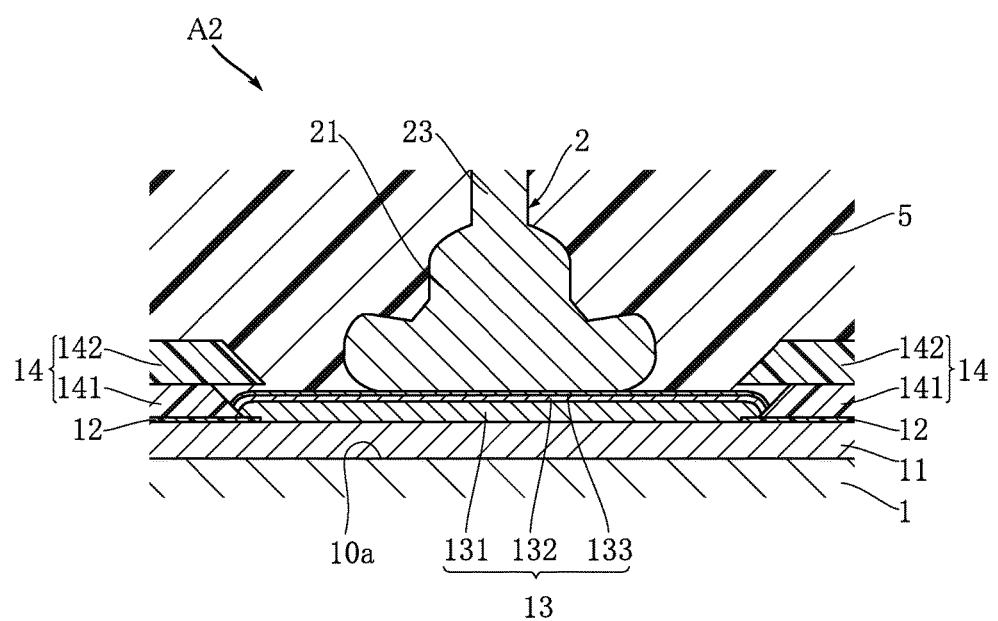
FIG. 18 is an enlarged fragmentary cross-sectional view of a semiconductor device according to a second embodiment of the present invention.
Figure 19:
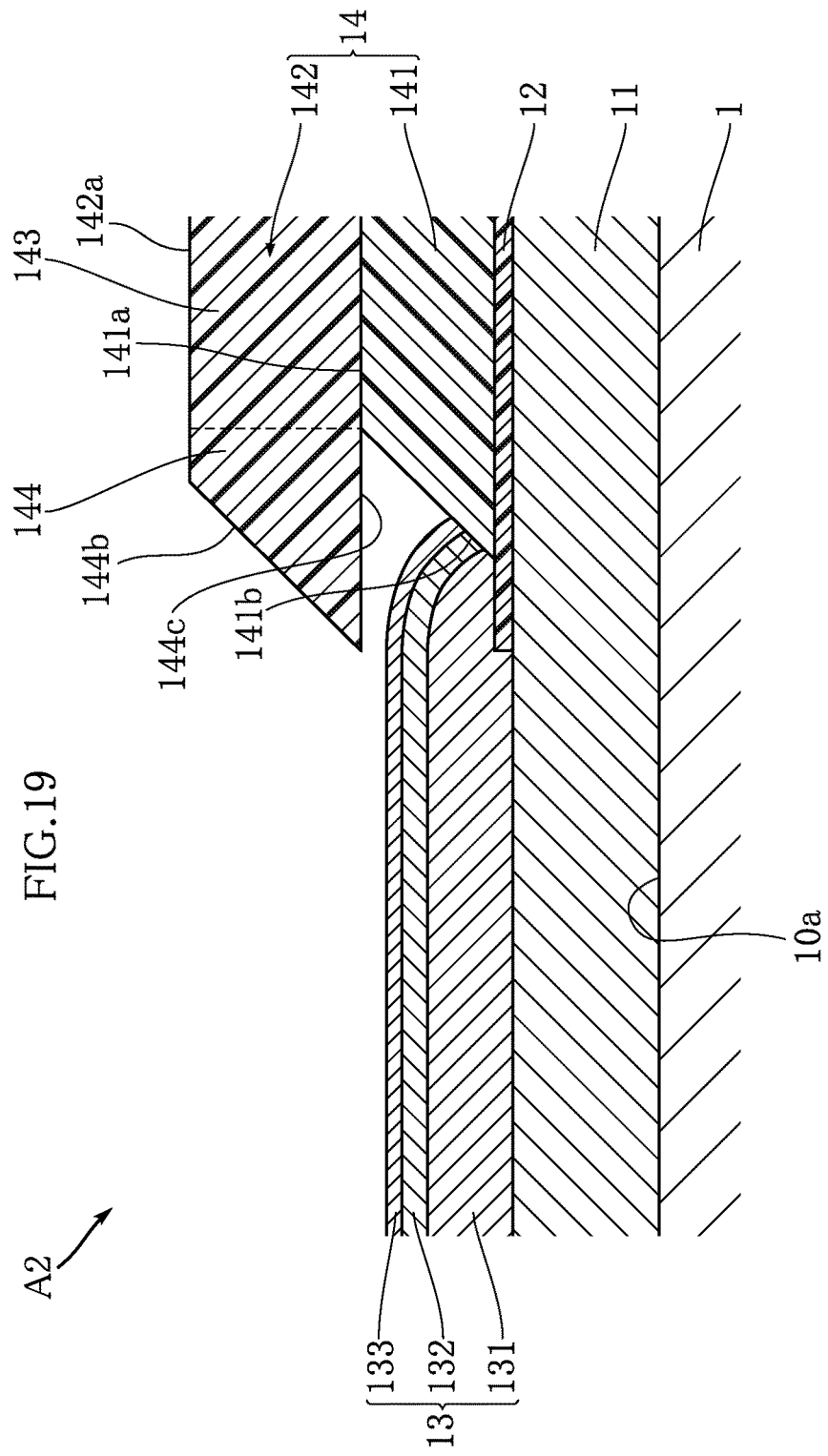
FIG. 19 is an enlarged fragmentary cross-sectional view of a part of FIG. 18.

FIG. 18 and FIG. 19 illustrate a semiconductor device according to a second embodiment of the present invention. In FIG. 18 and the subsequent drawings, the elements same as or similar to those of the foregoing embodiment are given the same numeral, and the description thereof may be omitted where appropriate. In FIG. 19, the wires 2 and the sealing resin 5 are omitted.

The semiconductor device A2 according to this embodiment is different from the foregoing embodiment in the configuration of the bonding pad 13 and the protection layer 14.

The protection layer 14 includes the first protection layer 141 and the second protection layer 142. The first protection layer 141 is made of an insulative material such as SiN. The first protection layer 141 has a thickness of, for example, 2 μm to 4 μm. The second protection layer 142 is superposed on the first protection layer 141, and made of an insulative material such as polyimide. The second protection layer 142 has a thickness of, for example, 3 μm to 6 μm.

Referring to FIG. 19, the first protection layer 141 includes the upper face 141a and the first side face 141b. In this embodiment, the first side face 141b is inclined so as to be more distant from the bonding pad 13, in the direction away from the semiconductor element 1 in the thickness direction of the semiconductor element 1.

The second protection layer 142 includes a main layer 143 and an eaves portion 144. The main layer 143 corresponds to the portion superposed on the first protection layer 141. The eaves portion 144 protrudes from the main layer 143 toward the bonding pad 13, in the direction orthogonal to the thickness direction of the semiconductor element 1. In FIG. 19, the boundary between the main layer 143 and the eaves portion 144 is indicated by broken lines, for the sake of clarity. The eaves portion 144 includes a side face 144b and a lower face 144c. The side face 144b is oriented to the bonding pad 13 in the direction orthogonal to the thickness direction of the semiconductor element 1. The lower face 144c is oriented to the semiconductor element 1, in the thickness direction of the semiconductor element 1. In this embodiment, the side face 144b is inclined so as to be more distant from the bonding pad 13, in the direction away from the semiconductor element 1 in the thickness direction of the semiconductor element 1.

The bonding pad 13 includes the first conductive layer 131, the second conductive layer 132, and the third conductive layer 133. The first to the third conductive layers 131 to 133 are each formed by metal plating.

The first conductive layer 131 covers the metal underlying layer 11. The first conductive layer 131 is made of a metal having lower ionization tendency than the metal underlying layer 11. The first conductive layer 131 has higher hardness than the metal underlying layer 11. For example, the first conductive layer 131 made of Ni satisfies such properties. The first conductive layer 131 has a thickness of, for example, 1 μm to 3 μm. The periphery of the first conductive layer 131 is in close contact with the surface of the protection layer 14. The first conductive layer 131 is thinner than the first protection layer 141. In this embodiment, the first conductive layer 131 covers a part of the first side face 141b of the first protection layer 141.

The second conductive layer 132 covers the first conductive layer 131. The second conductive layer 132 is made of a metal having lower ionization tendency than the first conductive layer 131. The second conductive layer 132 has higher hardness than the metal underlying layer 11. For example, the second conductive layer 132 made of Pd satisfies such properties. The second conductive layer 132 has a thickness of, for example, 0.1 μm to 0.5 μm. The periphery of the second conductive layer 132 is in close contact with the surface of the protection layer 14. The second conductive layer 132 is thinner than the first protection layer 141. In this embodiment, the second conductive layer 132 covers a part of the first side face 141b of the first protection layer 141.

The third conductive layer 133 covers the second conductive layer 132. The third conductive layer 133 is made of a metal having lower ionization tendency than the second conductive layer 132. For example, the third conductive layer 133 made of Au satisfies such properties. The third conductive layer 133 has a thickness of, for example, 10 nm to 0.1 μm. The periphery of the third conductive layer 133 is in close contact with the surface of the protection layer 14. The third conductive layer 133 is thinner than the first protection layer 141. In this embodiment, the third conductive layer 133 covers a part of the first side face 141b of the first protection layer 141. In addition, in this embodiment the overall thickness of the bonding pad 13 is thinner than the overall thickness of the first protection layer 141. Accordingly, the lower face 144c of the eaves portion 144 is more distant from the semiconductor element 1 than is the upper face of the bonding pad 13 (upper face of third conductive layer 133). Thus, the bonding pad 13 leaves the eaves portion 144 (second protection layer 142) exposed.

Referring now to FIG. 20 to FIG. 23, a manufacturing method of the semiconductor device A2 will be described. Here, FIG. 20 to FIG. 23 represent the formation process of the protection layer 14 and the bonding pad 13 (corresponding to manufacturing method of semiconductor device A1 shown in FIG. 7 and FIG. 8). The remaining process for manufacturing the semiconductor device A2 is the same as that of the semiconductor device A1, and therefore the corresponding description will not be repeated.

Figure 20:
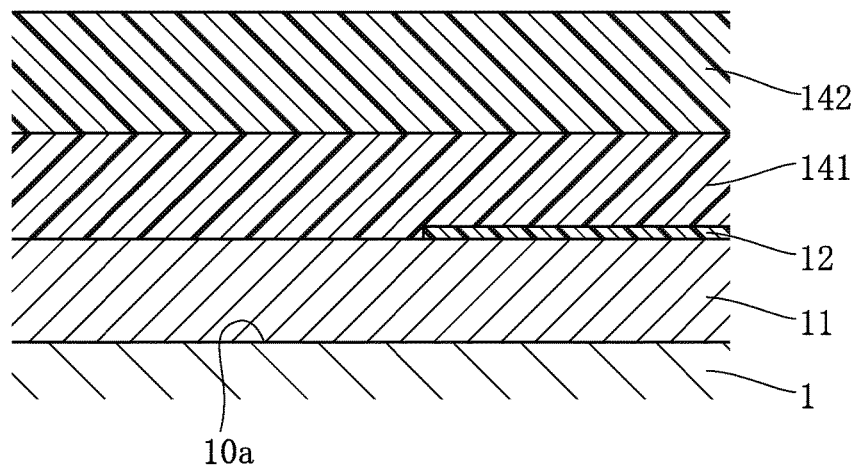
FIG. 20 is a fragmentary cross-sectional view showing a manufacturing process in a manufacturing method of the semiconductor device shown in FIG. 18.

Referring to FIG. 20, the first protection layer 141 and second protection layer 142 are formed. To form the first protection layer 141 and the second protection layer 142, for example, first a SiN layer and a polyimide layer are formed all over. The SiN layer is formed in a thickness of, for example, 2 μm to 4 μm. The polyimide layer is formed in a thickness of, for example, 3 μm to 6 μm.

Figure 21:
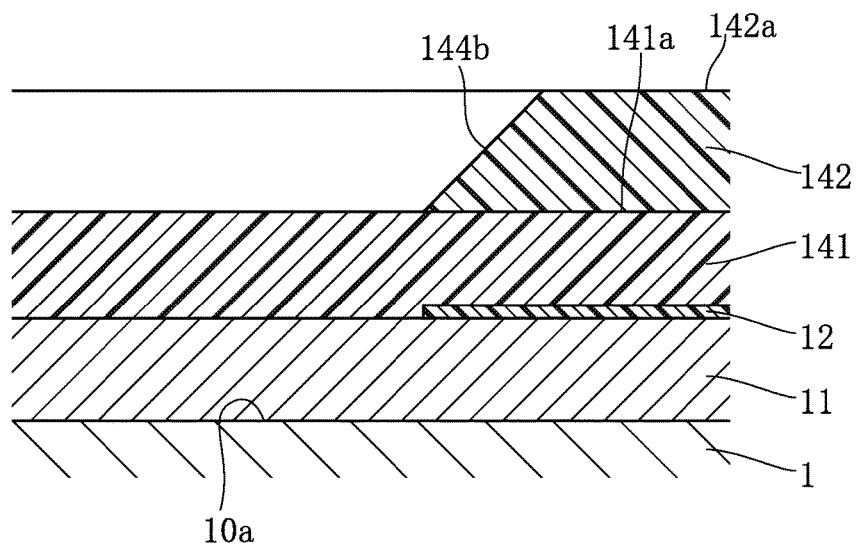
FIG. 21 is a fragmentary cross-sectional view showing a process that follows the process of FIG. 20.

Referring then to FIG. 21, the polyimide layer is partially removed through a patterning process such as etching, so as to expose a part of the upper face of the SiN layer thus to form the side face 144b. To partially remove the polyimide layer, for example an isotropic wet etching process with a mask may be employed. Through the mentioned process, the second protection layer 142 having the inclined side face 144b can be formed. At this point, the entirety of the second protection layer 142 is superposed on the SiN layer, and hence there is no distinction between the main layer 143 and the eaves portion 144.

Figure 22:
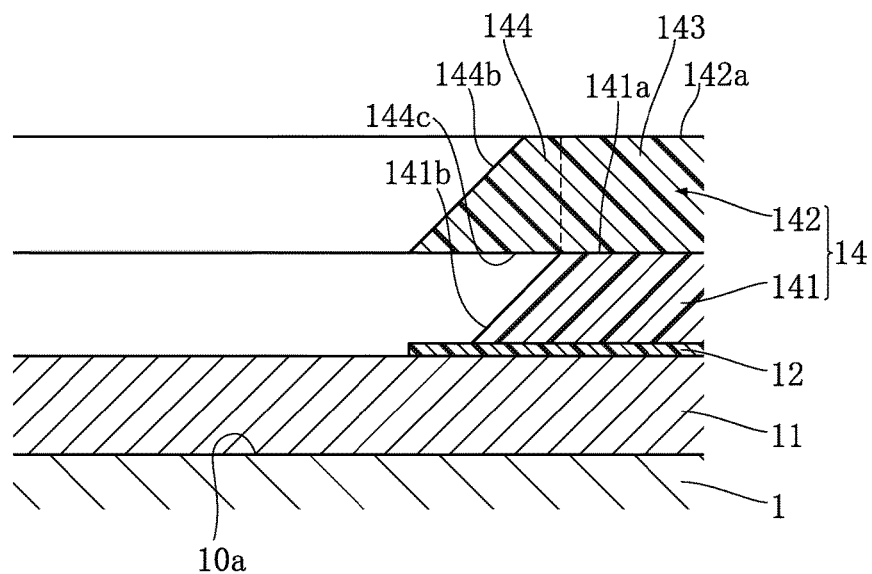
FIG. 22 is a fragmentary cross-sectional view showing a process that follows the process of FIG. 21.

Proceeding to FIG. 22, the SiN layer is partially removed through a patterning process such as etching, so as to expose the metal underlying layer 11. To partially remove the SiN layer, for example an isotropic wet etching process with a mask may be employed. To partially remove the polyimide layer and the SiN layer, a mask of the same opening pattern as the mask for partially removing the polyimide layer is employed. Through the mentioned process, the first protection layer 141 having the inclined first side face 141b can be formed. In addition, with the partial removal of the SiN layer, the eaves portion 144 becomes distinguishable from the main layer 143, in the second protection layer 142.

Figure 23:
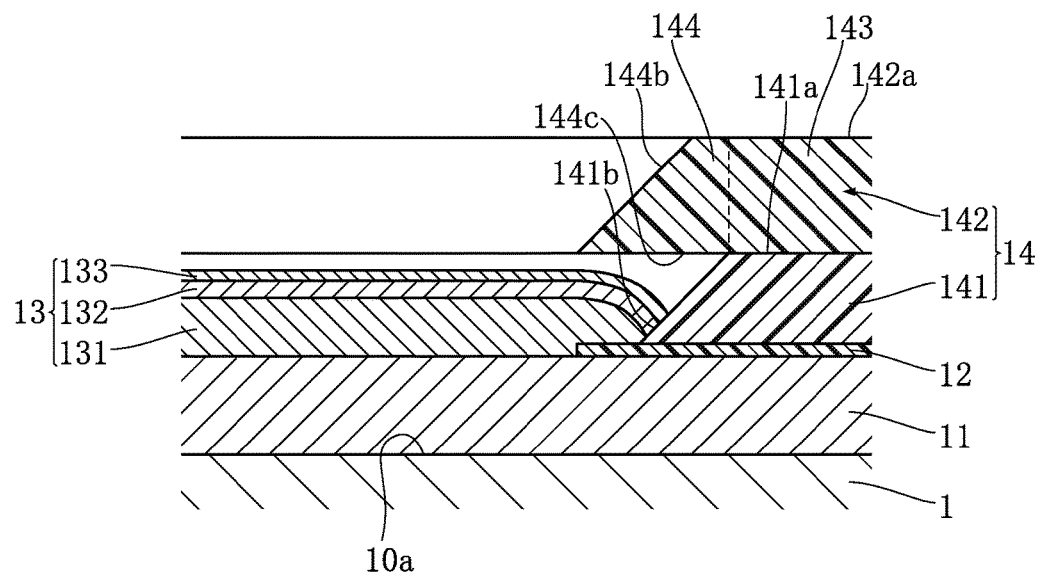
FIG. 23 is a fragmentary cross-sectional view showing a process that follows the process of FIG. 22.

Proceeding to FIG. 23, the bonding pad 13 is formed. To form the bonding pad 13, the first conductive layer 131, the second conductive layer 132, and the third conductive layer 133 are stacked on the region where the metal underlying layer 11 is exposed. The first conductive layer 131 is formed in a thickness of, for example, 1 μm to 3 μm. The second conductive layer 132 is formed in a thickness of, for example, 0.1 μm to 0.5 μm, and the third conductive layer 133 is formed in a thickness of, for example, 10 nm to 0.1 μm. The first to the third conductive layers 131 to 133 are each formed by metal plating, for example a non-electrolytic Ni/Pd/Au plating process. Through the mentioned process, the periphery of the bonding pad 13 (first conductive layer 131, second conductive layer 132, and third conductive layer 133) enters into close contact with the surface of the protection layer 14 (first protection layer 141), so as to cover a part of the protection layer 14.

The semiconductor device A2 provides the following advantageous effects.

In this embodiment, the bonding pad 13 is made of a metal having lower ionization tendency than the metal underlying layer 11, and the ionization tendency of the first conductive layer 131, the second conductive layer 132, and the third conductive layer 133 becomes lower in the order in which these layers are stacked on the metal underlying layer 11. Such a configuration effectively prevents the corrosion of the metal underlying layer 11 and the first conductive layer 131 located on the lower side.

The periphery of the bonding pad 13 (first conductive layer 131, second conductive layer 132, and third conductive layer 133) is in close contact with the surface of the protection layer 14 (first protection layer 141), so as to cover a part of the protection layer 14. The mentioned configuration effectively prevents the protection layer 14 from being delaminated, because of the close contact between the bonding pad 13 and the protection layer 14, compared with the case where, unlike in this embodiment, the protection layer is formed so as to cover the periphery of the bonding pad. Accordingly, the durability of the semiconductor device A2 can be improved.

In addition, since the periphery of the bonding pad 13 covers a part of the surface of the protection layer 14, the region where the first to the third conductive layers 131 to 133 constituting the bonding pad 13 are formed generally corresponds to the region where the metal of the bonding pad 13 is exposed, in a view in the thickness direction of the semiconductor element 1. Accordingly, the formation region of the first to the third conductive layers 131 to 133 constituting the bonding pad 13 can be made smaller, compared with the case where, unlike in this embodiment, the protection layer is formed so as to cover the periphery of the bonding pad. Such a configuration contributes to reducing the size of the semiconductor device A2.

In this embodiment, the first conductive layer 131 is in close contact with the insulation layer 12 and a part of the first side face 141b of the first protection layer 141, so as to collectively cover the mentioned regions. The first side face 141b is inclined as described above. Therefore, the first conductive layer 131 (bonding pad 13) effectively prevents the delamination of the first protection layer 141. The mentioned configuration further prevents moisture or a foreign matter from intruding as far as the metal underlying layer 11 through the interface between the first conductive layer 131 (bonding pad 13) and the protection layer 14 (first protection layer 141).

The first conductive layer 131 and the second conductive layer 132 have higher hardness than the metal underlying layer 11. Accordingly, even though the pressure of the capillary is applied to the bonding pad 13 during the bonding process of the wire 2 to the bonding pad 13, the bonding pad 13 and the metal underlying layer 11 can be prevented from being cracked or damaged.

Figure 24:
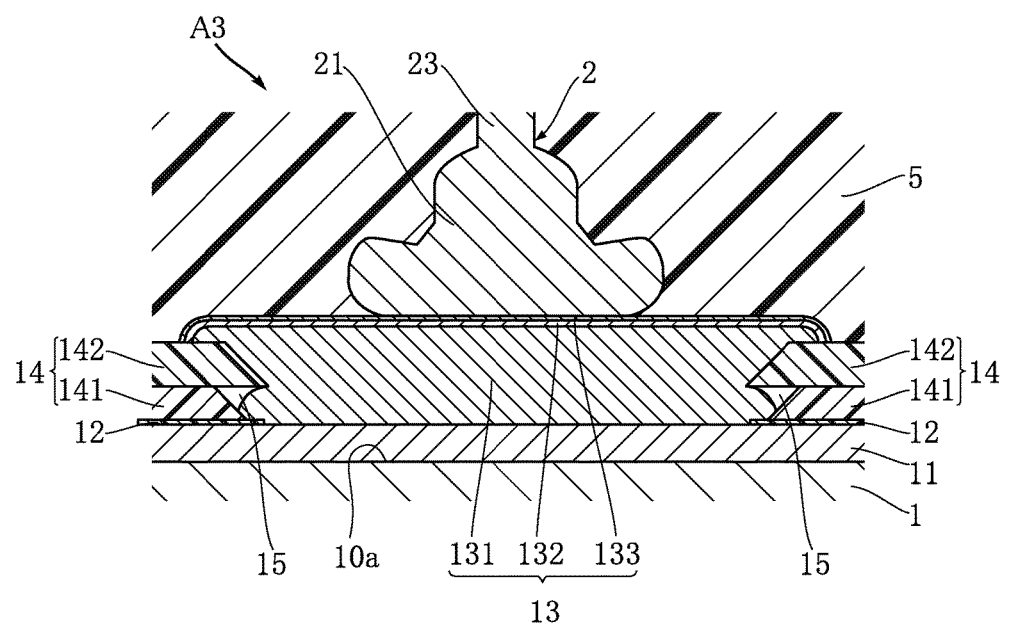
FIG. 24 is an enlarged fragmentary cross-sectional view of a semiconductor device according to a third embodiment of the present invention.
Figure 25:
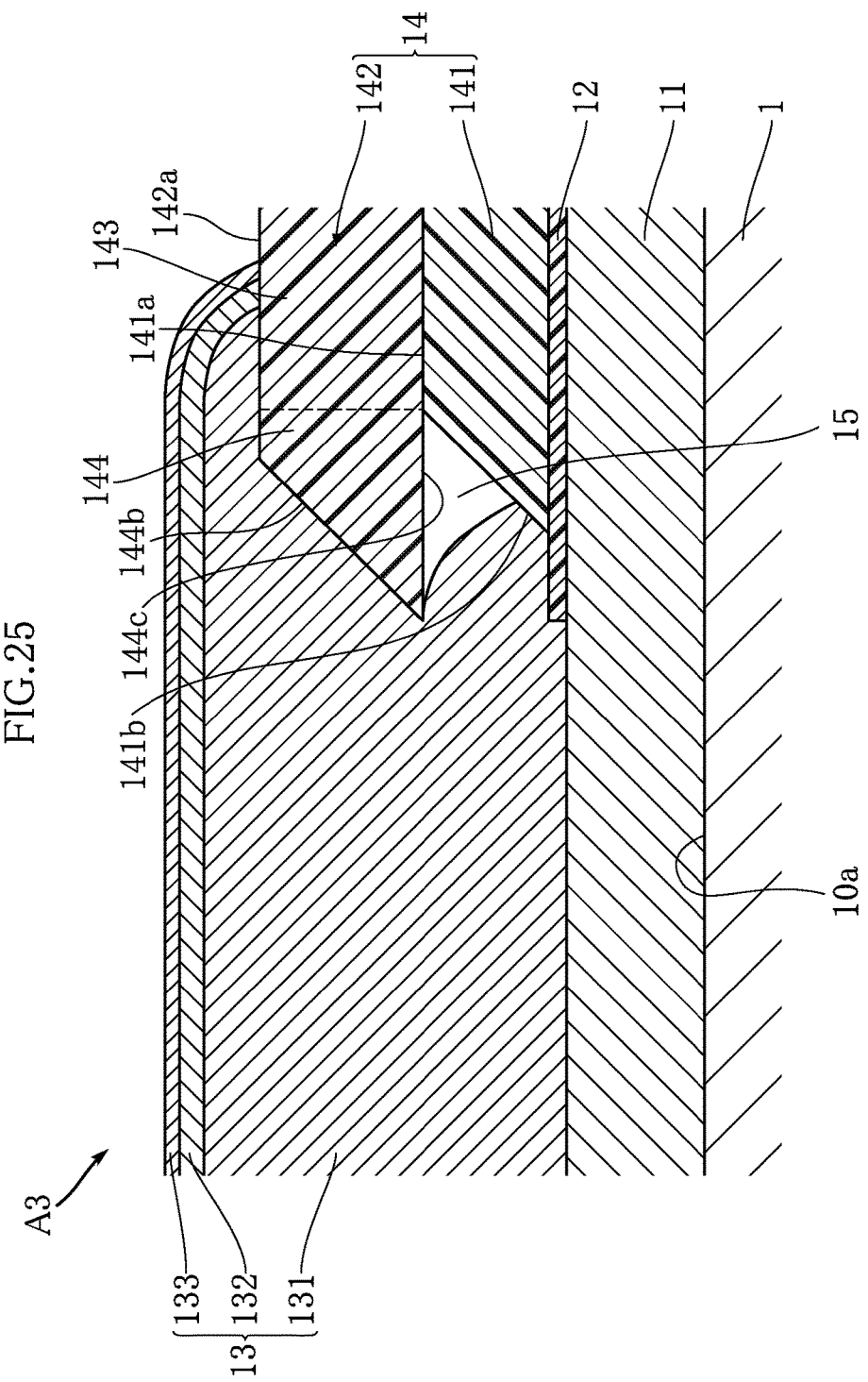
FIG. 25 is an enlarged fragmentary cross-sectional view of a part of FIG. 24.

FIG. 24 and FIG. 25 illustrate a semiconductor device according to a third embodiment of the present invention. In FIG. 25, the wires 2 and the sealing resin 5 are omitted.

The semiconductor device A3 according to this embodiment is different from the first embodiment in the configuration of the bonding pad 13 and the protection layer 14. The configuration of the protection layer 14 is the same as that of the second embodiment. Hereunder, the bonding pad 13 will be primarily focused on, and the description of the protection layer 14 may be omitted where appropriate.

The protection layer 14 includes a first protection layer 141 and a second protection layer 142. The first protection layer 141 is made of an insulative material such as SiN. The first protection layer 141 has a thickness of, for example, 2 μm to 4 μm. The second protection layer 142 is superposed on the first protection layer 141, and made of an insulative material such as polyimide. The second protection layer 142 has a thickness of, for example, 3 μm to 6 μm.

The bonding pad 13 includes the first conductive layer 131, the second conductive layer 132, and the third conductive layer 133. The first to the third conductive layers 131 to 133 are each formed by metal plating.

The first conductive layer 131 covers the metal underlying layer 11. The first conductive layer 131 is made of a metal having lower ionization tendency than the metal underlying layer 11. The first conductive layer 131 has higher hardness than the metal underlying layer 11. For example, the first conductive layer 131 made of Ni satisfies such properties. The first conductive layer 131 has a thickness of, for example, 6 μm to 12 μm. The periphery of the first conductive layer 131 is in close contact with the surface of the protection layer 14. The first conductive layer 131 is thicker than the overall thickness of the protection layer 14 (total of thicknesses of first protection layer 141 and second protection layer 142). In this embodiment, the first conductive layer 131 covers a part of the first side face 141b of the first protection layer 141 and the entirety of the side face 144b. However, the first conductive layer 131 leaves the lower face 144c exposed. Accordingly, a void 15 is defined by the lower face 144c, the first side face 141b of the first protection layer 141, and the first conductive layer 131.

The second conductive layer 132 covers the first conductive layer 131. The second conductive layer 132 is made of a metal having lower ionization tendency than the first conductive layer 131. The second conductive layer 132 has higher hardness than the metal underlying layer 11. For example, the second conductive layer 132 made of Pd satisfies such properties. The second conductive layer 132 has a thickness of, for example, 0.1 μm to 0.5 μm. The periphery of the second conductive layer 132 is in close contact with the surface of the protection layer 14. In this embodiment, the second conductive layer 132 covers a part of the upper face 142a of the second protection layer 142 extending as far as the side face 144b.

The third conductive layer 133 covers the second conductive layer 132. The third conductive layer 133 is made of a metal having lower ionization tendency than the second conductive layer 132. For example, the third conductive layer 133 made of Au satisfies such properties. The third conductive layer 133 has a thickness of, for example, 10 nm to 0.1 μm. The periphery of the third conductive layer 133 is in close contact with the surface of the protection layer 14. In this embodiment, the third conductive layer 133 covers a part of the upper face 142a of the second protection layer 142.

Referring now to FIG. 26 to FIG. 29, a manufacturing method of the semiconductor device A3 will be described. Here, FIG. 26 to FIG. 29 represent the formation process of the bonding pad 13 (corresponding to manufacturing method of semiconductor device A2 shown in FIG. 23). The remaining process for manufacturing the semiconductor device A3 is the same as that of the semiconductor device A2, and therefore the corresponding description will not be repeated.

To form the bonding pad 13, the first conductive layer 131, the second conductive layer 132, and the third conductive layer 133 are stacked on the region where the metal underlying layer 11 is exposed. The first conductive layer 131 is formed in a thickness of, for example, 6 μm to 12 μm. The second conductive layer 132 is formed in a thickness of, for example, 0.1 μm to 0.5 μm, and the third conductive layer 133 is formed in a thickness of, for example, 10 nm to 0.1 μm. The first to the third conductive layers 131 to 133 are each formed by metal plating, for example a non-electrolytic Ni/Pd/Au plating process.

Figure 26:
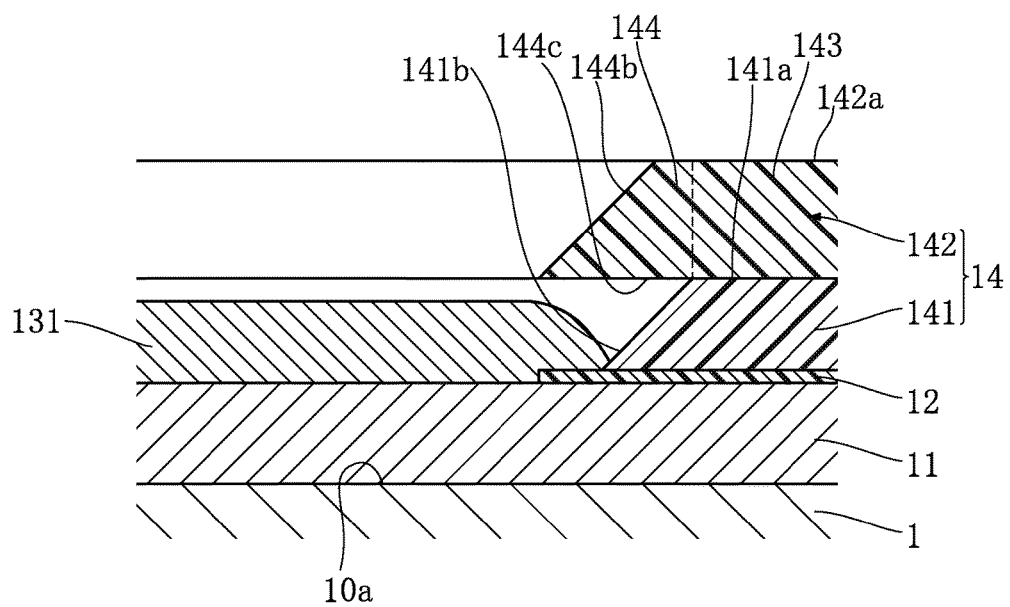
FIG. 26 is a fragmentary cross-sectional view showing a manufacturing process in a manufacturing method of the semiconductor device shown in FIG. 24.
Figure 27:
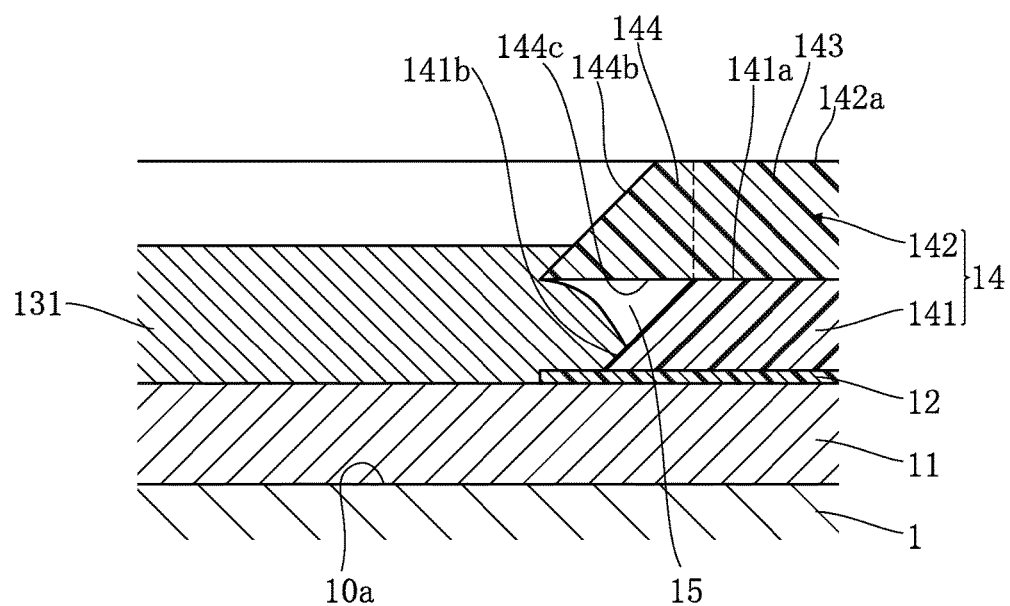
FIG. 27 is a fragmentary cross-sectional view showing a process that follows the process of FIG. 26.
Figure 28:
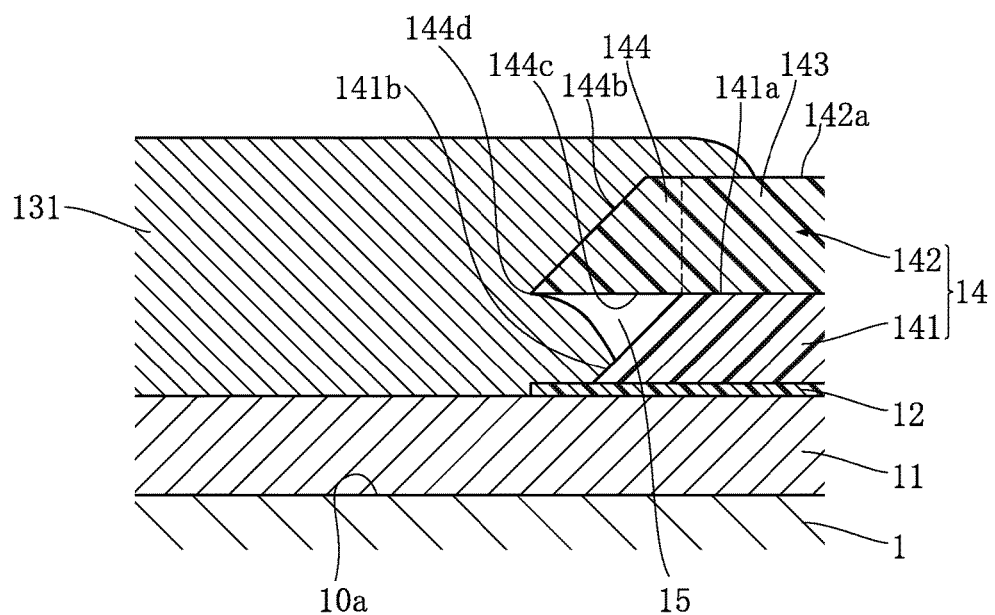
FIG. 28 is a fragmentary cross-sectional view showing a process that follows the process of FIG. 27.

FIG. 26 to FIG. 28 illustrate the formation process of the first conductive layer 131. Through the plating process, the first conductive layer 131 grows so as to increase the thickness. FIG. 26 illustrates a stage where the first conductive layer 131 is still relatively thin, and the upper face of the first conductive layer 131 (oriented in the same direction as the first main surface 10a of the semiconductor element 1) is closer to the semiconductor element 1 than is the upper face 141a of the first protection layer 141, in the thickness direction of the semiconductor element 1. At this point, the periphery of the first conductive layer 131 proceeds toward the first protection layer 141 in the direction orthogonal to the thickness direction of the semiconductor element 1, so as to cover a part of the first side face 141b of the first protection layer 141. FIG. 27 illustrates a stage subsequent to FIG. 26, where the first conductive layer 131 has slightly grown compared with FIG. 26. At this point, the upper face of the first conductive layer 131 is more distant from the semiconductor element 1 than is the upper face 141a of the first protection layer 141, but is closer to the semiconductor element 1 than is the upper face 142a of the second protection layer 142, in the thickness direction of the semiconductor element 1. Here, the first conductive layer 131 abuts against a leading edge 144d (see FIG. 28) formed at the intersection of the side face 144b and the lower face 144c, to thereby stop proceeding further toward the first protection layer 141. Thus, the void 15 is defined by the lower face 144c of the eaves portion 144, the first side face 141b of the first protection layer 141, and the first conductive layer 131.

FIG. 28 illustrates a stage where the formation of the first conductive layer 13 has been completed. At this point, the upper face of the first conductive layer 131 more distant from the semiconductor element 1 than is the upper face 142a of the second protection layer 142 in the thickness direction of the semiconductor element 1, and the first conductive layer 131 covers a part of the upper face 142a of the second protection layer 142.

Figure 29:
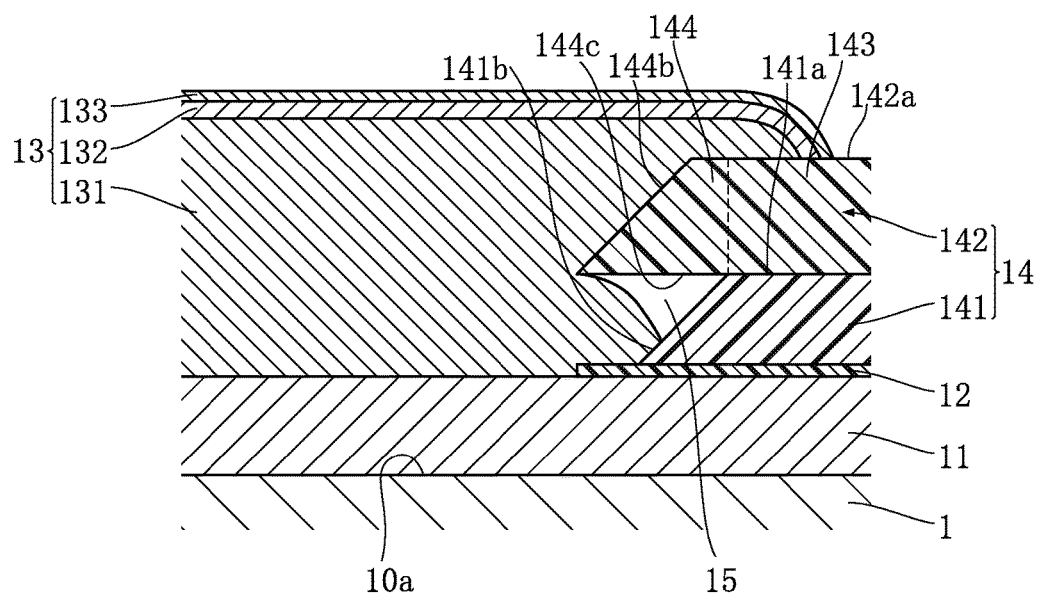
FIG. 29 is a fragmentary cross-sectional view showing a process that follows the process of FIG. 28.

Proceeding to FIG. 29, the second conductive layer 132 and the third conductive layer 133 are sequentially superposed on the first conductive layer 131. The bonding pad 13 can thus be obtained.

The semiconductor device A3 provides the following advantageous effects.

In this embodiment, the bonding pad 13 is made of a metal having lower ionization tendency than the metal underlying layer 11, and the ionization tendency of the first conductive layer 131, the second conductive layer 132, and the third conductive layer 133 becomes lower in the order in which these layers are stacked on the metal underlying layer 11. Such a configuration effectively prevents the corrosion of the metal underlying layer 11 and the first conductive layer 131 located on the lower side.

The periphery of the bonding pad 13 (first conductive layer 131, second conductive layer 132, and third conductive layer 133) is in close contact with the surface of the protection layer 14 (first protection layer 141 and first protection layer 141), so as to cover a part of the protection layer 14. The mentioned configuration effectively prevents the protection layer 14 from being delaminated, because of the close contact between the bonding pad 13 and the protection layer 14, compared with the case where, unlike in this embodiment, the protection layer is formed so as to cover the periphery of the bonding pad. Accordingly, the durability of the semiconductor device A3 can be improved.

In addition, since the periphery of the bonding pad 13 covers a part of the surface of the protection layer 14, the region where the first to the third conductive layers 131 to 133 constituting the bonding pad 13 are formed corresponds to the region where the metal of the bonding pad 13 is exposed, in a view in the thickness direction of the semiconductor element 1. Accordingly, the formation region of the first to the third conductive layers 131 to 133 constituting the bonding pad 13 can be made smaller, compared with the case where, unlike in this embodiment, the protection layer is formed so as to cover the periphery of the bonding pad. Such a configuration contributes to reducing the size of the semiconductor device A3.

In this embodiment, the first conductive layer 131 is in close contact with the insulation layer 12, a part of the first side face 141b of the first protection layer 141, the entirety of the side face 144b of the second protection layer 142, and a part of the upper face 142a of the second protection layer 142, so as to cover the mentioned regions. Therefore, the first conductive layer 131 (bonding pad 13) effectively prevents the delamination of the protection layer 14 (first protection layer 141 and first protection layer 141). The mentioned configuration further prevents moisture or a foreign matter from intruding as far as the metal underlying layer 11 through the interface between the first conductive layer 131 (bonding pad 13) and the protection layer 14.

Further, the configuration in which the first side face 141b and the side face 144b are inclined as above, the bonding pad 13 (first conductive layer 131) covering these portions effectively prevents the first protection layer 141 and the second protection layer 142 from being separated from the end portion (vicinity of first side face 141b and side face 144b), thereby further assuring the prevention of the delamination of the protection layer 14.

The first conductive layer 131 and the second conductive layer 132 have higher hardness than the metal underlying layer 11. Accordingly, even though the pressure of the capillary is applied to the bonding pad 13 during the bonding process of the wire 2 to the bonding pad 13, the bonding pad 13 and the metal underlying layer 11 can be prevented from being cracked or damaged.

Figure 30:
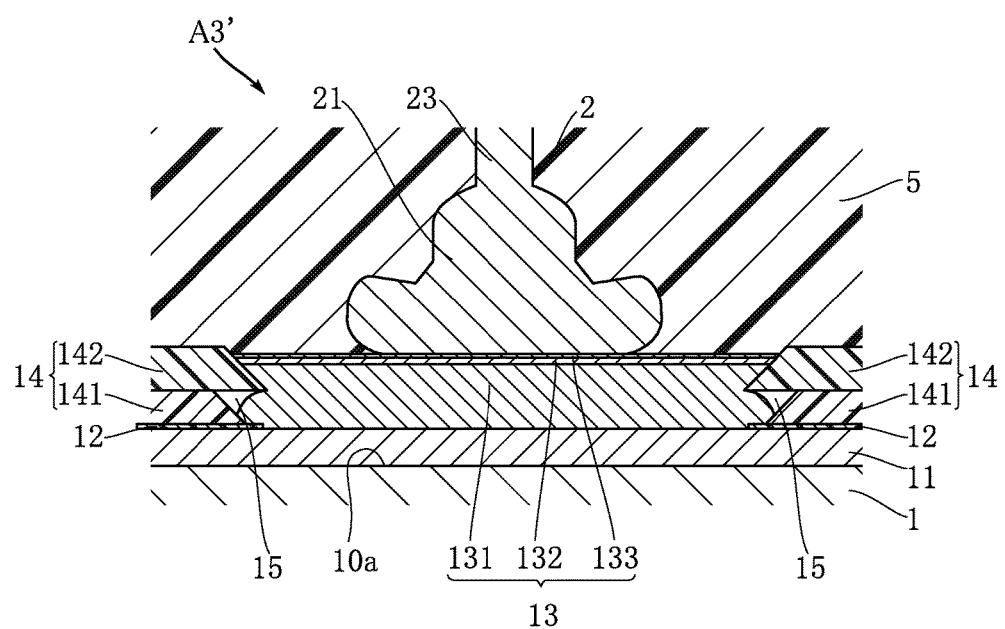
FIG. 30 is an enlarged fragmentary cross-sectional view of a variation of the semiconductor device according to the third embodiment of the present invention.
Figure 31:
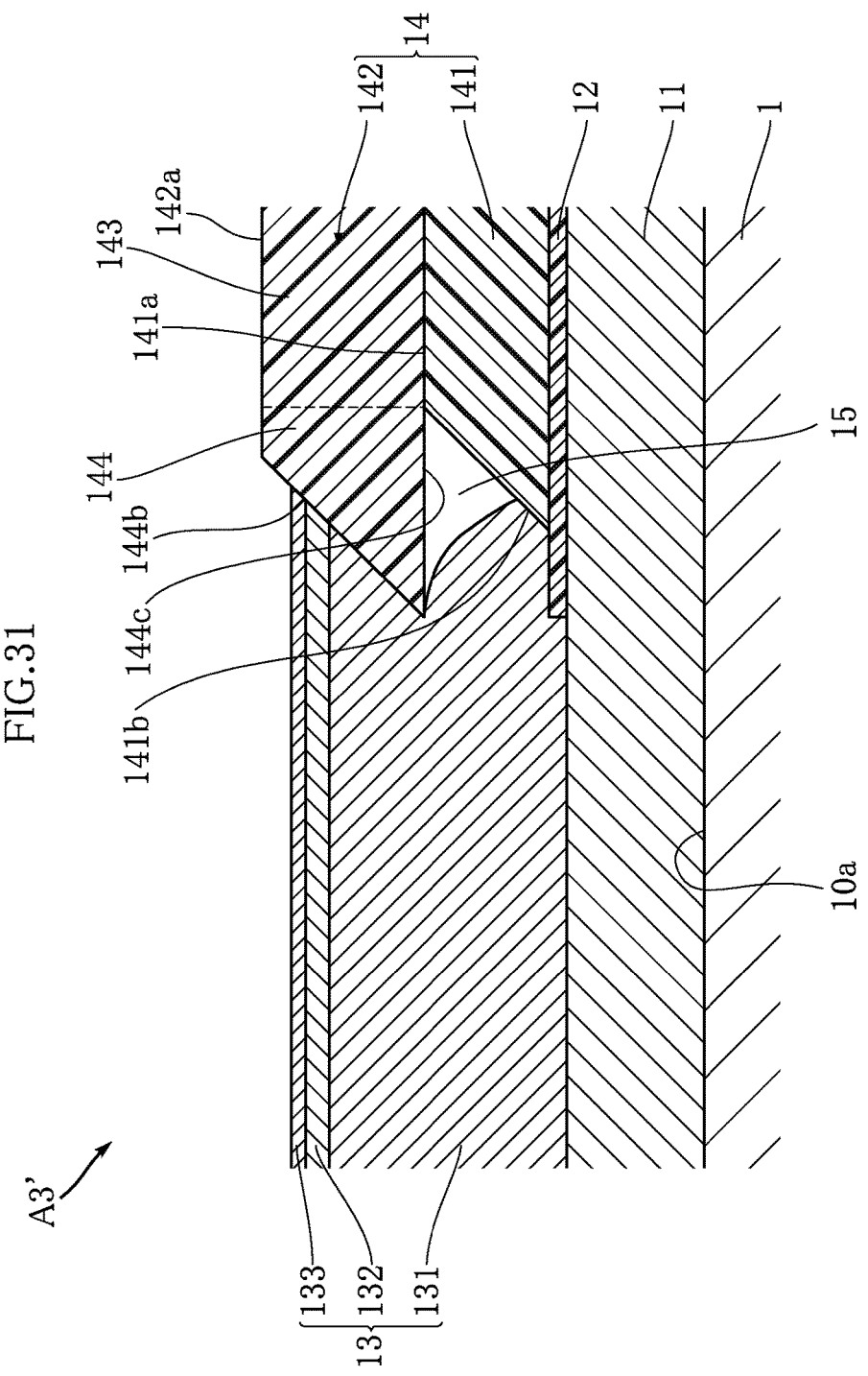
FIG. 31 is an enlarged fragmentary cross-sectional view of a part of FIG. 30.

FIG. 30 and FIG. 31 illustrate a variation of the semiconductor device A3. The semiconductor device A3' shown in FIG. 30 and FIG. 31 is different from the semiconductor device A3 in the thickness of the bonding pad 13.

More specifically, in the semiconductor device A3' according to this variation, the first conductive layer 131 is thinner than that of the semiconductor device A3. The first conductive layer 131 is thicker than the first protection layer 141, but thinner than the overall thickness of the protection layer 14 (total of thicknesses of first protection layer 141 and second protection layer 142). In addition, the overall thickness of the bonding pad 13 (total of thicknesses of first conductive layer 131, second conductive layer 132, and third conductive layer 133) is also thinner than the overall thickness of the protection layer 14. Accordingly, the bonding pad 13 (first to third conductive layers 131 to 133) covers a part of the side face 144b, and leaves the upper face 142a of the second protection layer 142 exposed. The semiconductor device A3' thus configured also provides the same advantageous effects as those provided by the semiconductor device A3.

Semiconductor devices of the invention are not limited to the above embodiments. Specific configurations of the device of the invention may be modified in various manners.

The invention claimed is:

1. A semiconductor device comprising:
a semiconductor element including a first main surface and a second main surface that are spaced apart from each other in a thickness direction; and
a wire,
wherein the semiconductor element includes: a metal underlying layer formed on the first main surface; a bonding pad formed on the metal underlying layer and to which the wire is bonded; and an insulative protection layer formed on the first main surface and surrounding the bonding pad as viewed in the thickness direction,
the bonding pad includes: a first conductive layer covering the metal underlying layer and made of a metal having a lower ionization tendency than the metal underlying layer; and a second conductive layer covering the first conductive layer and made of a metal having a lower ionization tendency than the first conductive layer,
the first conductive layer and the second conductive layer have peripheries, respectively, that are in close contact with the protection layer and cover a part of the protection layer,
a part of the metal underlying layer is sandwiched between the first main surface and the protection layer so that said part of the metal underlying layer does not directly contact the first conductive layer,
the protection layer does not directly contact any part of an entirety of a top surface of the bonding pad,
the protection layer includes a first protection layer and a second protection layer formed on the first protection layer,
the first protection layer and the second protection layer include a first side face and a second side face, respectively, that are oriented to the bonding pad in a direction orthogonal to the thickness direction,
the second side face of the second protection layer is shifted in a direction opposite to the bonding pad with respect to the first side face of the first protection layer, and
the first conductive layer is held in direct contact with an entirety of the first side face of the first protection layer, a part of an upper face of the first protection layer, and a part of the second side face of the second protection layer.

2. The semiconductor device according to claim 1, further comprising an insulation layer interposed between the protection layer and the metal underlying layer.

3. The semiconductor device according to claim 1, wherein
the second conductive layer covers a part of the second side face of the second protection layer and exposes an upper face of the second protection layer.

4. The semiconductor device according to claim 1, wherein the first side face of the first protection layer and the second side face of the second protection layer are each inclined so as to be more distant from the bonding pad with increasing distance from the semiconductor element in the thickness direction.

5. The semiconductor device according to claim 1, wherein the first protection layer is made of SiN.

6. The semiconductor device according to claim 1, wherein the first conductive layer contains Ni.

7. The semiconductor device according to claim 1, wherein the second conductive layer contains Pd.

8. The semiconductor device according to claim 1, wherein the first conductive layer and the second conductive layer have a higher hardness than the metal underlying layer.

9. The semiconductor device according to claim 1, wherein the first conductive layer is thicker than the second conductive layer.

10. The semiconductor device according to claim 1, wherein the first conductive layer and the second conductive layer are formed by metal plating.

11. The semiconductor device according to claim 1, wherein the bonding pad includes a third conductive layer that covers and is thinner than the second conductive layer, and the third conductive layer is made of a metal having a lower ionization tendency than the second conductive layer.

12. The semiconductor device according to claim 1, wherein the wire is made of a Cu-based metal.

* * * * *